United States Patent
Kim et al.

(10) Patent No.: US 12,125,517 B2
(45) Date of Patent: Oct. 22, 2024

(54) MULTI-RAIL POWER TRANSITION

(71) Applicant: Micron Technology, Inc., Boise, ID (US)

(72) Inventors: Kang-Yong Kim, Boise, ID (US); Hyun Yoo Lee, Boise, ID (US); Keun Soo Song, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 17/804,414

(22) Filed: May 27, 2022

(65) Prior Publication Data
US 2022/0406357 A1   Dec. 22, 2022

Related U.S. Application Data

(60) Provisional application No. 63/212,536, filed on Jun. 18, 2021.

(51) Int. Cl.
| | | |
|---|---|---|
| *G11C 11/4074* | (2006.01) | |
| *G11C 11/4076* | (2006.01) | |
| *G11C 11/4093* | (2006.01) | |
| *G11C 11/4096* | (2006.01) | |

(52) U.S. Cl.
CPC ...... *G11C 11/4074* (2013.01); *G11C 11/4076* (2013.01); *G11C 11/4093* (2013.01); *G11C 11/4096* (2013.01)

(58) Field of Classification Search
CPC ............................. G11C 11/4074; G11C 11/40
USPC ........................................................ 365/205
See application file for complete search history.

(56) References Cited

U.S. PATENT DOCUMENTS

| | | |
|---|---|---|
| 9,299,419 B1 | 3/2016 | Singh et al. |
| 9,817,601 B1 | 11/2017 | Zhang et al. |
| 2002/0024881 A1 | 2/2002 | Nishioka |
| 2002/0120878 A1 | 8/2002 | Lapidus |
| 2005/0052936 A1 | 3/2005 | Hardee |
| 2009/0108899 A1 | 4/2009 | Bhatia et al. |
| 2011/0058439 A1 | 3/2011 | Lee et al. |
| 2015/0029800 A1 | 1/2015 | Iijima et al. |

(Continued)

OTHER PUBLICATIONS

"International Search Report and Written Opinion", Application No. PCT/US2022/072635, Sep. 15, 2022, 9 pages.

(Continued)

*Primary Examiner* — Muna A Techane
(74) *Attorney, Agent, or Firm* — Colby Nipper PLLC

(57) ABSTRACT

This document describes apparatuses and techniques for multi-rail power transition. In various aspects, a power rail controller transitions a memory circuit (e.g., of a memory die) from a first power rail to a second power rail. The power rail controller then changes a voltage of the first power rail from a first voltage to a second voltage. The power rail controller may also adjust termination impedance or a clock frequency of the memory circuit before transitioning the memory circuit to the second power rail. The power rail controller then transitions the memory circuit from the second power rail to the first power rail to enable operation of the memory circuit at the second voltage. By so doing, the power rail controller may improve the reliability of memory operations when transitioning operation of the memory circuit from the first voltage to the second voltage.

29 Claims, 19 Drawing Sheets

(56) References Cited

U.S. PATENT DOCUMENTS

| | | |
|---|---|---|
| 2018/0247689 A1 | 8/2018 | Gans |
| 2019/0027206 A1* | 1/2019 | Kim .................... G11C 11/4074 |
| 2019/0043545 A1 | 2/2019 | Boehm |
| 2019/0146531 A1 | 5/2019 | Yung et al. |
| 2019/0279688 A1* | 9/2019 | Rowley ..................... G06F 1/28 |
| 2021/0391795 A1* | 12/2021 | Gandhi ............... H02M 3/1582 |
| 2022/0171546 A1* | 6/2022 | Yu ........................... G06F 3/061 |
| 2022/0406365 A1 | 12/2022 | Kim et al. |

OTHER PUBLICATIONS

"International Preliminary Report on Patentability", Application No. PCT/US2022/072635, Dec. 14, 2023, 5 pages.
"Non-Final Office Action", U.S. Appl. No. 17/804,422, Jun. 21, 2024, 14 pages.

* cited by examiner

MULTI-RAIL POWER TRANSITION

CROSS-REFERENCE TO RELATED APPLICATIONS

The present application claims priority to U.S. Provisional Patent Application Ser. No. 63/212,536, filed Jun. 18, 2021, the entire disclosure of which is hereby incorporated by reference.

BACKGROUND

Computers, smartphones, and other electronic devices operate using processors and memories. A processor enables a user to run applications and programs by executing a set of instructions that process data. Generally, the processor obtains the set of instructions and data from a memory that stores this information. Advances in processors have often outpaced those of memory. This outpacing, along with many demands on memory devices, results in processor execution speeds that are often limited by the speed of memories. Applications on electronic devices may also operate on ever-larger data sets that require ever-larger memories. Further, manufacturers of memories or electronic devices may face demands for faster execution speeds of memories while also enabling power conservation of an electronic device. Accommodating these various demands for memory performance and power conservation results in numerous signal integrity requirements for signal integrity to ensure accurate memory operation under increasing demands and power constraints.

BRIEF DESCRIPTION OF THE DRAWINGS

Apparatuses of and techniques for multi-rail power transition for memory circuits are described with reference to the following drawings. The same numbers are used throughout the drawings to reference like features and components.

DETAILED DESCRIPTION

Overview

Figure 1:
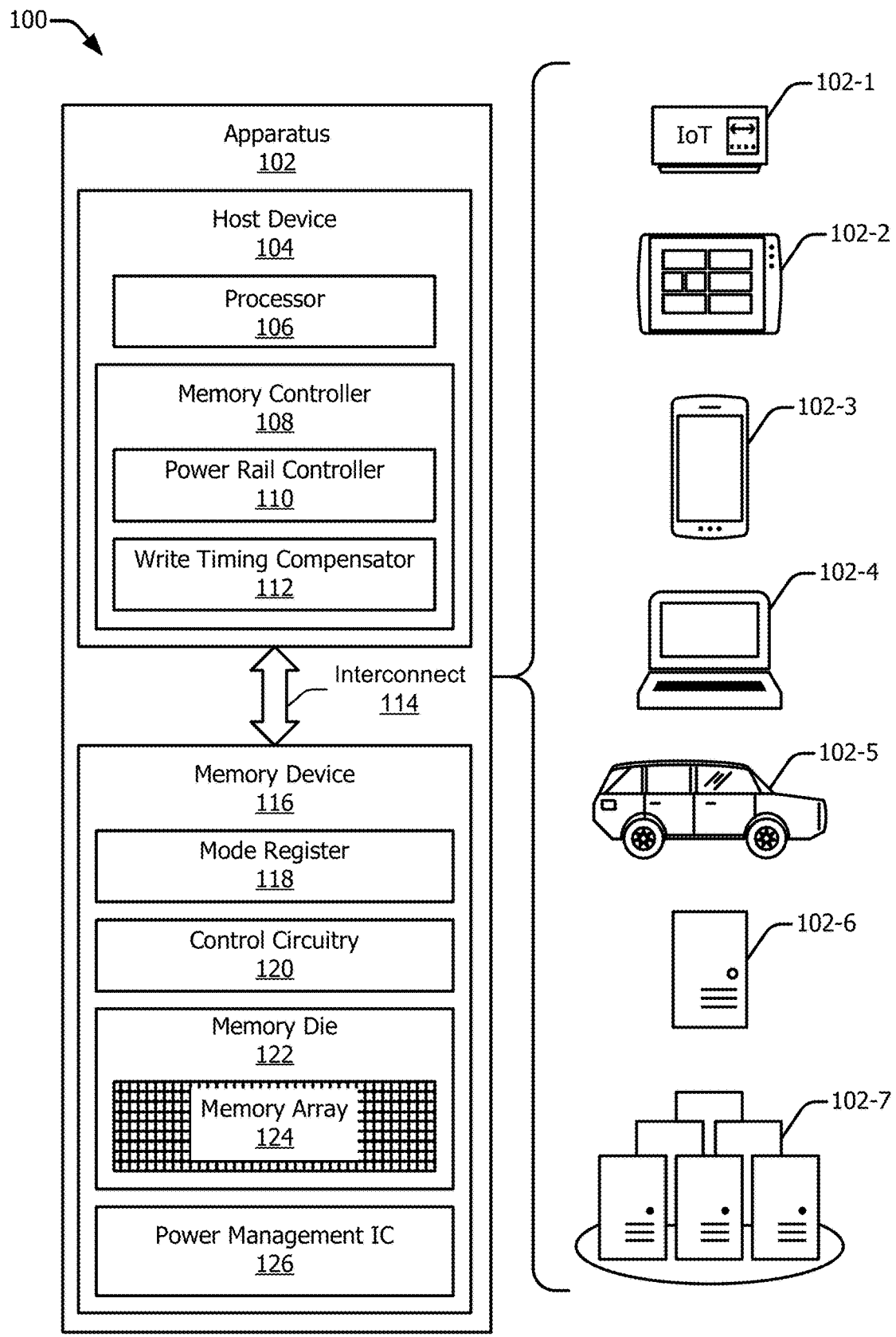
FIG. 1 illustrates an apparatus in which aspects of multi-rail power transition can be implemented for a memory system.

Computers, smartphones, and other electronic devices operate using processors and memories to run a variety of programs and applications, ranging from low-power operating systems and background utilities to computationally intensive applications for high-resolution graphics, computational simulations, artificial intelligence (AI), and so forth. Execution speeds associated with these programs and applications are often related to the performance of a memory of the device, which is contingent, in part, on a frequency of clock signals used to enable and coordinate operation of the memory.

By way of review, a memory device operates based on clock signals by which data is transferred between a memory controller and the memory device. To increase data transfer rates, the memory controller can increase a clock frequency or operating frequency of the memory device. Increasing the operating frequency of the memory device, however, may cause signal integrity issues related to compression or shifting of clock line and/or data line signaling transitions at the higher operating frequencies. Thus, the memory controller may also scale an operating voltage of the memory device along with the increased operating frequency to address the signal integrity issues that arise in relation to changes in operating frequency. In other cases, when the operating frequency of the memory device is reduced when memory performance demands are lower, the operating voltage of the memory device can also be reduced to lower memory device power consumption. Due to the complexities associated with coordinating and timing changes between various combinations of memory device operating frequency and voltage, access to the memory device may be impaired or suspended while the memory controller reconfigures the memory device to account for a settling time of the clock frequency or operating voltage to prevent data loss.

To address these and other issues associated with changing operating frequencies and voltages of memory, this document describes aspects of multi-rail power transition and write timing compensation. Various aspects, example circuits, memory devices, and methods are described herein for transitioning a memory circuit between multiple power rails and/or compensating memory access timing to improve memory operation and signaling integrity across different combinations of clock frequencies and operating voltages. In an example aspect, a power rail controller transitions a memory circuit (e.g., of a memory die) from a first power rail to a second power rail. The power rail controller then changes a voltage of the first power rail from a first voltage to a second voltage. The power rail controller may also adjust termination impedance or a clock frequency of the memory circuit before transitioning the memory circuit to the second power rail. The power rail controller then transitions the memory circuit from the second power rail to the first power rail to enable operation of the memory circuit at the second voltage. By so doing, the power rail controller may improve the reliability of memory operations when transitioning power provided to the memory circuit from the first voltage to the second voltage. Other examples of multi-rail power transition or write timing compensation are described within this disclosure.

Example Operating Environments

FIG. 1 illustrates at 100 an apparatus 102 in which aspects of multi-rail power transition for memory circuits can be implemented. The apparatus 102 can include, for example, an internet-of-things (IoT) device 102-1, tablet device 102-2, smartphone 102-3, notebook computer 102-4, an automobile 102-5, server computer 102-6, server cluster 102-7 that may be part of cloud computing infrastructure or a data center, or a portion thereof (e.g., a printed circuit board (PCB)). Other examples of the apparatus 102 include a wearable device (e.g., a smartwatch or intelligent glasses), entertainment device (e.g., a set-top box, video dongle, smart television, a gaming device), desktop computer, motherboard, server blade, consumer appliance, public transportation device, drone, industrial equipment, security device, sensor, or an electronic component thereof. These example apparatus configurations can include one or more components to provide various computing functionalities, data processing, and/or features.

In the example implementations shown at 100, the apparatus 102 may include a host device 104 with at least one processor 106 and at least one memory controller 108. The apparatus 102 can be implemented in various manners with more, fewer, or different components. For example, the host device 104 may include multiple cache memories (e.g., including multiple levels of cache memory) associated with the processor 106 and/or the memory controller 108 or no cache memory. In other implementations, the host device 104 may omit the processor 106 or the memory controller 108. In addition to one or more cache memories, the host device 104 can include additional components to form a system-on-a-chip (SoC).

The processor 106 may be implemented as any suitable type of processor, which may include a general-purpose processor, one or more processing cores, a central processing unit (CPU), a graphics processing unit (GPU), a neural network engine or accelerator, an application-specific integrated circuit (ASIC), a field-programmable gate array (FPGA) integrated circuit (IC), a communications processor (e.g., a modem or baseband processor), or the like. In operation, the memory controller 108 can provide a high-level or logical interface between the processor 106 and at least one memory (e.g., a memory array or external memory) that is coupled to the host device 104 using a respective interconnect. The memory controller 108 can, for example, receive memory requests from the processor 106 and provide the memory requests to a memory array with appropriate formatting, timing, and reordering in accordance with a memory access protocol or specification (e.g., protocols of a Low-Power Double Data Rate 5 (LPDDR5) or Low-Power Double Data Rate 5 (LPDDR6)). The memory controller 108 can also forward or return memory responses received from the memory array to the processor 106.

The memory controller 108 depicted in 100 includes a power rail controller 110 and a write timing compensator 112. A memory interconnect 114 operably couples the host device 104 (e.g., via host interface) or the memory controller 114 to a memory device 116 (e.g., via an interface to the interconnect). In aspects, the power rail controller 110 controls operating parameters of one or more power rails from which one or more memory circuits (e.g., memory dies) of the memory device 116 operate. For example, the power rail controller 110 can couple a memory circuit to different power rails or adjust an operating voltage a power rail to operate the memory circuit at a different voltage. In aspects, the write timing compensator 112 adjusts or tunes write path circuitry of the memory controller 108 or a memory circuit of the memory device 116 to compensate for changes in operating voltage, operating frequency, and/or signal timing of the memory circuit, such as when the memory circuit is transitioned between different combinations of operating frequency and voltage. Generally, the memory controller 108 can receive commands, instructions, or indications from the processor 106 to configure an operating frequency, operating voltage, or timing compensation by which to operate the memory device 116 and/or to transmit an indication of the selected operating frequency, operating voltage, or timing compensation to the memory device 116. For example, the processor 106 may implement a memory performance utility that provides an indication to the memory controller 108 for a desired or target level of memory performance. The memory controller 108 may use this or other information provided by the processor 106 to configure an operating frequency and/or operating voltage of the memory device 116.

In some aspects, the memory controller 108 may include a memory performance monitor (not shown) that uses memory performance metrics or memory access information to characterize or profile memory access performance. Based on the memory access performance, the memory monitor can determine an operating configuration for the memory device 116, such as an operating frequency, an operating voltage, or a timing compensation by which to operate the memory device 116. For example, the memory performance monitor can profile the memory access performance associated with the memory device 116 and compare the memory access performance with a respective performance threshold (e.g., minimum or maximum performance threshold) of an operating configuration (e.g., frequency and voltage) of the memory device 116. The memory performance monitor may then determine to use a different operating configuration (associated with higher performance or lower performance) of the memory device 116 to align performance (e.g., latency or bandwidth) of the memory device 116 with the profiled memory access performance and use the power rail controller 110 and/or the write timing compensator 112 to reconfigure the memory device 116.

The memory device 116, which is coupled to the host device 104 using the interconnect 114, can be implemented as any suitable type of memory module, memory die, memory array, memory circuit, or the like. Examples of the memory device 116 include a DRAM package or module (e.g., an LPDDR synchronous DRAM (SDRAM)). The DRAM package or module can include a three-dimensional (3D) stacked DRAM device, a high-bandwidth memory (HBM) device, or a hybrid memory cube (HMC) device. In general, there are multiple types of DRAM. As one example, a low-power double data rate (DDR) memory, also referred to as LPDDR or mobile DDR, is a DDR SDRAM. LPDDR generally uses less power than other types of DDR SDRAM. In some applications, a SDRAM memory, a LPDDR memory, or other memory may be configurable to operate using different combinations of operating frequency and operating voltage for scalable performance to support applications or memory access profiles that range from low-power, moderate, or memory intensive.

As shown in 100, the memory device 116 may include or be implemented with a mode register 118 (or a registered clock driver (RCD)), control circuitry 120, and one or more memory dies 122 that include a respective memory array 124. In some cases, the memory array 124 includes one or more memory banks. While the power rail controller 110 and/or write timing compensator 112 are depicted in 100 as part of the host device 104, in general, either of these entities (or a portion thereof) can be implemented as a component of the apparatus 102, the memory device 116, or mode register 118. Generally, the memory device 116 can also perform operations to, for example, communicate with other devices, manage memory performance, and perform memory read or write operations using various components of the mode register 118, control circuitry 120, and/or memory die 122.

The mode register 118 of the memory device 116 may receive commands from the memory controller 108 to control or configure various operating parameters of the memory device 116 or memory dies 122. For example, the mode register may configure clock settings, power settings, termination settings, or the like for one or more memory dies 122 of the memory device 116. Though not depicted in FIG. 1, the control circuitry 120 of the memory device 116 can include, for example, one or more registers, array control logic, clock circuitry, write path circuitry, read path circuitry, and so forth. The control circuitry 120 can also synchronize various memory components with one or more clock signals received from the memory controller, including a clock (CK) signal (e.g., a true CK (CK_t) or a complementary CK (CK_c)) or a WCK signal (e.g., WCK_t or WCK_c). The control circuitry 120 can additionally use an internal clock signal to synchronize memory components. The CK and/or WCK signals can be used to set a transfer rate of a command and address (CA) signal and a rate at which data (DQ) and data strobes (DQS) are transferred between a host device and the memory die 122. For example, an LPDDR5 or an LPDDR6 compliant memory device 116 or memory die 122 can transfer DQ data at speeds of 3.2 gigabits per second (Gbps), 4.266 Gbps, 6.4 Gbps, or 12.8 Gbps. Alternatively or additionally, the control circuitry 120 of the memory device 116 can generate read data strobe (RDQS) signals to provide a clock signal to internal logic of the memory controller 108 for receiving and decoding data responses received from the memory device 116 over a DQ bus of the interconnect.

The memory array 124 of the memory die 122 can include any suitable type or configuration of a memory circuit or memory cells, including but not limited to memory cells of DRAM, SDRAM, 3D-stacked DRAM, DDR memory, LPDRAM, or LPDDR SDRAM. For example, the memory array 124 can include memory cells of SDRAM configured as a memory module with one channel containing either 16 or 8 DQ signals, double-data-rate input/output (I/O) signaling, and support for a supply voltage. The density of the memory die 122 or memory array 124 can range, for instance, from 2 gigabits (Gb) to 32 Gb. The memory die 122, memory array 124, and the control circuitry 120 may be components of a single semiconductor die or separate semiconductor dies. In some cases, the memory array 124 or the control circuitry 120 are distributed across multiple memory dies 122 of the memory device 116.

The host device 104 can be operatively coupled, using the interconnect 114 of the apparatus 102, to a cache memory (not shown), which may be operatively coupled to the memory device 116. As shown in this example, the memory device 116 is connected to the host device 104 using the interconnect 114 without an intervening buffer or cache. The memory device 116 may also operatively couple to a storage memory (not shown) of the apparatus 102. The storage memory can include, for example, a storage-class memory device (e.g., a flash memory, hard disk drive, solid-state drive, phase-change memory (PCM), or memory employing 3D XPoint™). The host device 104 can be coupled, directly or indirectly using the interconnect 114, to the memory device 116 and a storage memory. This interconnect 114 can transfer data between two or more components of the apparatus 102. Examples of the interconnects include a bus, switching fabric, and one or more signal lines that carry voltage or current signals. Though not illustrated, the interconnect 114 can include at least one command/address (CA) bus and at least one data (DQ) bus. Each bus may be a unidirectional or a bidirectional bus. In some implementations, an interconnect 114 may also include a chip-select (CS) I/O that can, for example, couple to one or more CS pins of the memory device 116. An interconnect 114 may also include a CK bus that is part of or separate from the CA bus.

Alternatively or additionally, the memory device 116 may have an "internal" or "local" cache memory for storing or buffering data for read and/or write operations. In some cases, the host device 104 and the memory device 116 can be disposed on, or physically supported by, a PCB (e.g., a rigid or flexible motherboard). The host device 104 and the memory device 116 may additionally be integrated on an IC or fabricated on separate ICs packaged together. The memory device 116 may also be coupled to multiple host devices 104 using one or more interconnects and may respond to memory requests from two or more host devices 104. Each host device 104 may include a respective memory controller 108, or the multiple host devices 104 may share a memory controller 108.

The memory device 116 also includes a power management integrated circuit 126 (PMIC 126) that provides power to one or more components of the memory device 116. In aspects, the PMIC 126 provides multiple power rails from which the one or more memory die 122 of the memory device operate. For example, the PMIC 126 may receive power from the apparatus 102 or host device 104 at a first voltage level (e.g., 12 Volts (12V)) and provide multiple static and/or dynamic power rails to the memory die 122. The memory controller 108 may control operational parameters of the PMIC 126 using respective mode register commands, which may, for example, transition a memory die 122 from one power rail to another power rail and/or alter a voltage level of a power rail. These and other capabilities of the PMIC 126 may be used to implement aspects of multi-rail power transition, examples of which are described herein.

Figure 2:
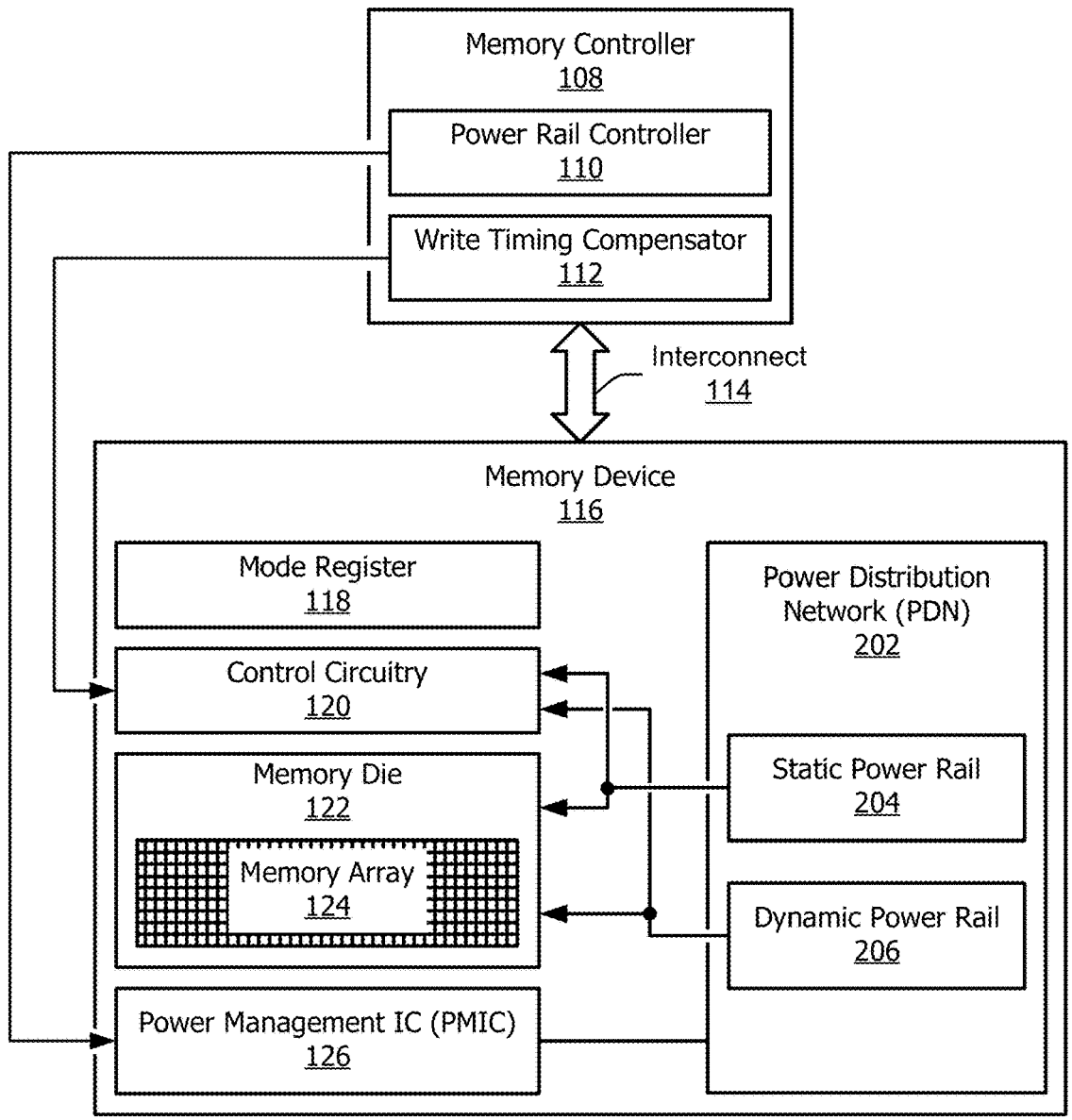
FIG. 2 illustrates an example configuration of a power management integrated circuit and power distribution network implemented in accordance with one or more aspects.

FIG. 2 illustrates at 200 an example configuration of a power management integrated circuit of FIG. 1 and power distribution network implemented in accordance with various aspects of multi-rail power transition for memory circuits. Generally, the PMIC 126 regulates power received from power interconnects (e.g., power pins, power pads, power balls, power contacts, or the like) of the memory device 116 to provide multiple power rails from which components and circuitry of the memory device 116 operate. As shown at 200, the power rail controller 110 of the memory controller 108 may control or manage operation of the PMIC 126 of the memory device 116.

Alternatively or additionally, the write timing compensator 112 of the memory controller 108 can control or manager operation of the control circuitry 120, including clock/data receive circuitry, of the memory device 116. In aspects, the power rail controller 110, write timing compensator 112, or memory controller 108 may issue commands or control signals (e.g., mode register commands) over the interconnect 114 to the mode register 118 to control or manage functionalities of the control circuitry 120, the PMIC 126, the memory die 122, a power distribution network 202, or other components of the memory device 116.

In the example of FIG. 2, the PMIC 126 provides power to the components of the memory device 116 through the power distribution network 202 (PDN 202). The PDN 202 may include any suitable number of power rails, power nets, conductive paths, power distribution nodes, directional power flow components (e.g., diodes), power switching devices (e.g., a field-effect transistor (FET)), or the like to manage the distribution of power provided by the PMIC 126 to the components of the memory device 116. In aspects, the PMIC 126 and PDN 202 provide and distribute multiple power rails with respective voltages that may be static or dynamic (e.g., configurable or controllable). In aspects of multi-rail power transition, the PMIC 126 and PDN 202 are configured to provide a static power rail 204 and a dynamic power rail 206, which the power rail controller 110 uses to implement one or more aspects described herein. As shown at 200, the static power rail 204 can be operably coupled to the control circuitry 120 and/or memory die 122, and the dynamic power rail 206 can be operably coupled to the control circuitry 120 and/or the memory die 122.

The PMIC 126 may be configured to provide power through the static power rail 204 at a voltage to enable operation of a core (e.g., high-frequency clock system) of the memory device 116. As such, the static power rail 204 may be referred to as a "core supply" or "core path" of power provided by the PMIC 126. In some cases, the voltage of the static power rail 204 may be selected based on a process characterization of the memory device 116 and/or memory die 122. For example, the voltage of the static power rail 204 can be determined based on a process characterization of semiconductor and/or fabrication variances of a wafer from which the memory device 116 or memory dies 122 are formed. Generally, the voltage of the static power rail 204 may be regulated within an acceptable tolerance range of a voltage level selected to operate the core and core-related circuitry of the memory device 116. Although described as static, in some cases, the power rail controller 110 or PMIC 126 may adjust or reconfigure the voltage of the static power rail 204.

In aspects, the PMIC 126 is configurable or controlled by the power rail controller 110 to provide power through the dynamic power rail 206 at multiple voltage levels. In some cases, the multiple voltage levels are configured to enable operation of the memory die 122 or memory array 124 at different operating frequencies. For example, the PMIC 126 may alter the voltage of the dynamic power rail 206 from 0.8V for memory operation at 3.2 Gbps, 0.9V for memory operation at 6.4 Gbps, 1.0V for memory operation at 12.8 Gbps, and so forth. The dynamic power rail 206 may provide operation power for the memory die 122, as well as other areas (e.g., non-core areas) of the memory device 116, which may include peripheral circuitry, the mode register 118, the control circuitry 120, side-band communication components, command/address logic, or the like. The various configurations and implementations of the PMIC 126 and PDN 202 are further described with reference to FIG. 3.

Figure 3:
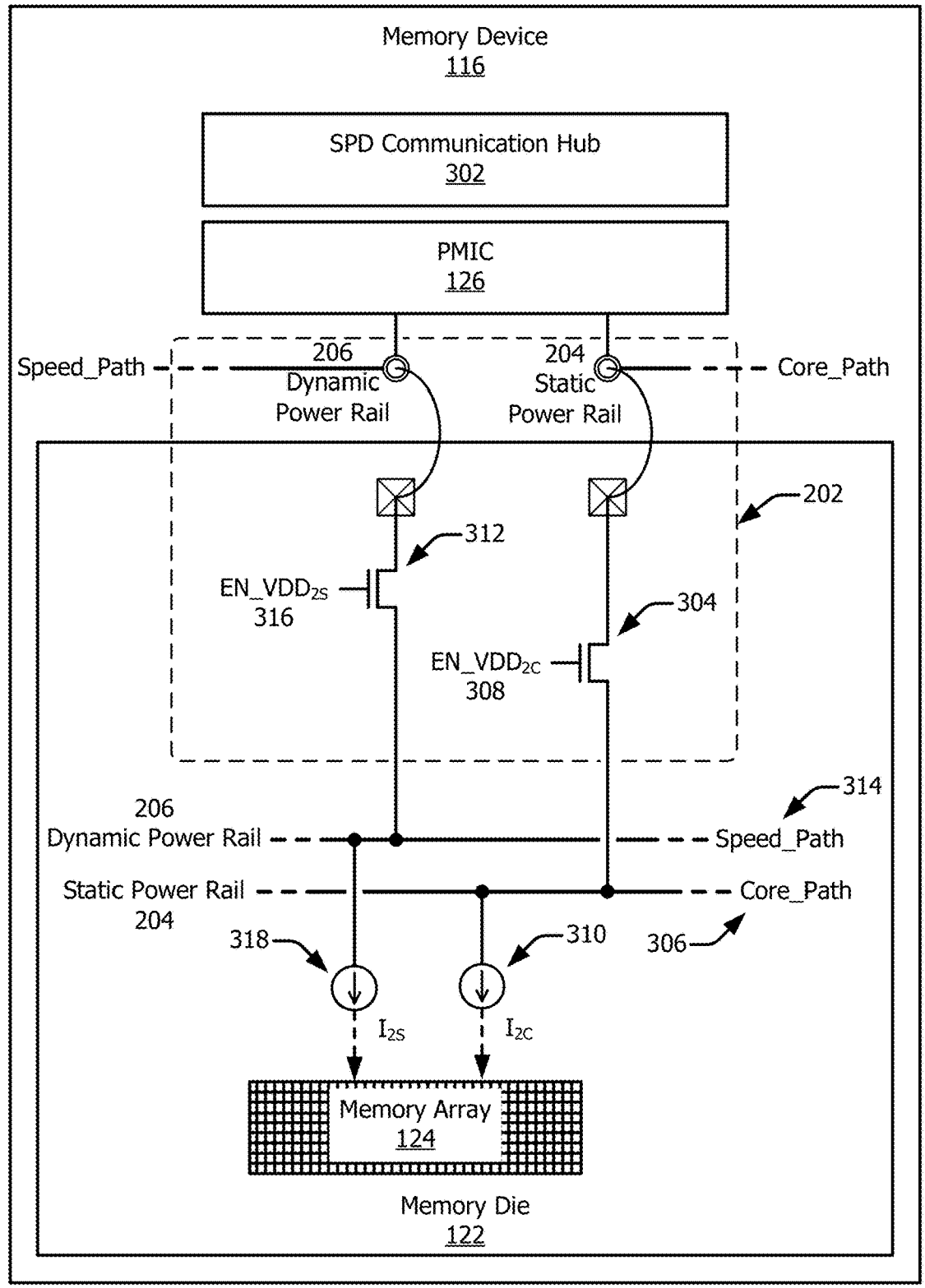
FIG. 3 illustrates an example power distribution network capable of distributing power from a static power rail and a dynamic power rail in accordance with one or more aspects.

FIG. 3 illustrates at 300 an example power distribution network capable of distributing power from a static power rail and a dynamic power rail in accordance with one or more aspects. In aspects of multi-rail power transition, a memory device 116 or memory package includes a PMIC 126 and PDN 202 configured to provide power to a memory die 122 or memory array 124 from a static power rail 204 or a dynamic power rail 206. In other aspects, the memory controller 108 may include or be operably coupled to a PMIC 126 and a PDN 202 to power circuitry of the memory controller 108 (e.g., write timing compensation circuits) using a static power rail 204 or a dynamic power rail 206. Generally, the memory controller 108 or power rail controller 110 controls the PMIC 126 to provide power to the static power rail 204 at a first voltage level and power to dynamic power rail 206 at a second voltage level, which is configurable. In the example of FIG. 3, the memory device 116 is implemented with a serial presence detect (SPD) communication hub 302 that is configured to relay commands from the mode register 118 to the PMIC 126. Alternatively or additionally, the memory controller 108 or power rail controller 110 may communicate with the PMIC 126 or PDN 202 through the mode register 118 and/or other logic of the memory device 116 to implement aspects of multi-rail power transition.

As shown at 300, the PDN 202 includes respective contacts to receive power from the dynamic power rail 206 or the static power rail 204 from the PMIC 126 of the memory device 116. In aspects, the PDN 202 includes a first switch device 304 to control application (e.g., coupling or decoupling) of the static power rail 204 to circuitry of the memory die 122 that is coupled to a corresponding or internal version of the static power rail 204 or core path 306 of the memory die 122. Thus, when the memory controller 108 or power rail controller 110 asserts the enable core path voltage rail signal 308 (EN_VDD$_{2C}$), the static power rail 204 is coupled to the internal or operational power rail of the memory die 122 to provide core current 310 (I$_{2C}$ 310) to the circuitry and memory array 124 of the memory die 122 that is coupled to the static power rail 204. Conversely, when the memory controller 108 or power rail controller 110 deasserts the enable core path voltage rail signal 308, the first switch device 304 decouples the static power rail 204 from the internal or operational power rail of the memory die 122.

With respect to the dynamic power rail 206, in aspects the PDN 202 includes a second switch device 312 to control application (e.g., coupling or decoupling) of the dynamic power rail 206 to circuitry of the memory die 122 that is coupled to a corresponding or internal version of the dynamic power rail 206 or speed path 314 of the memory die 122. Thus, when the memory controller 108 or power rail controller 110 asserts the enable speed path voltage rail signal 316 (EN_VDD$_{2S}$), the dynamic power rail 206 is coupled to the internal or operational power rail of the memory die 122 to provide speed current 318 (I$_{2S}$ 318) to the circuitry and memory array 124 of the memory die 122 that is coupled to the dynamic power rail 206. Conversely, when the memory controller 108 or power rail controller 110 deasserts the enable speed path voltage rail signal 310, the switch device 304 decouples the dynamic power rail 206 from the internal or operational power rail of the memory die 122.

Figure 4:
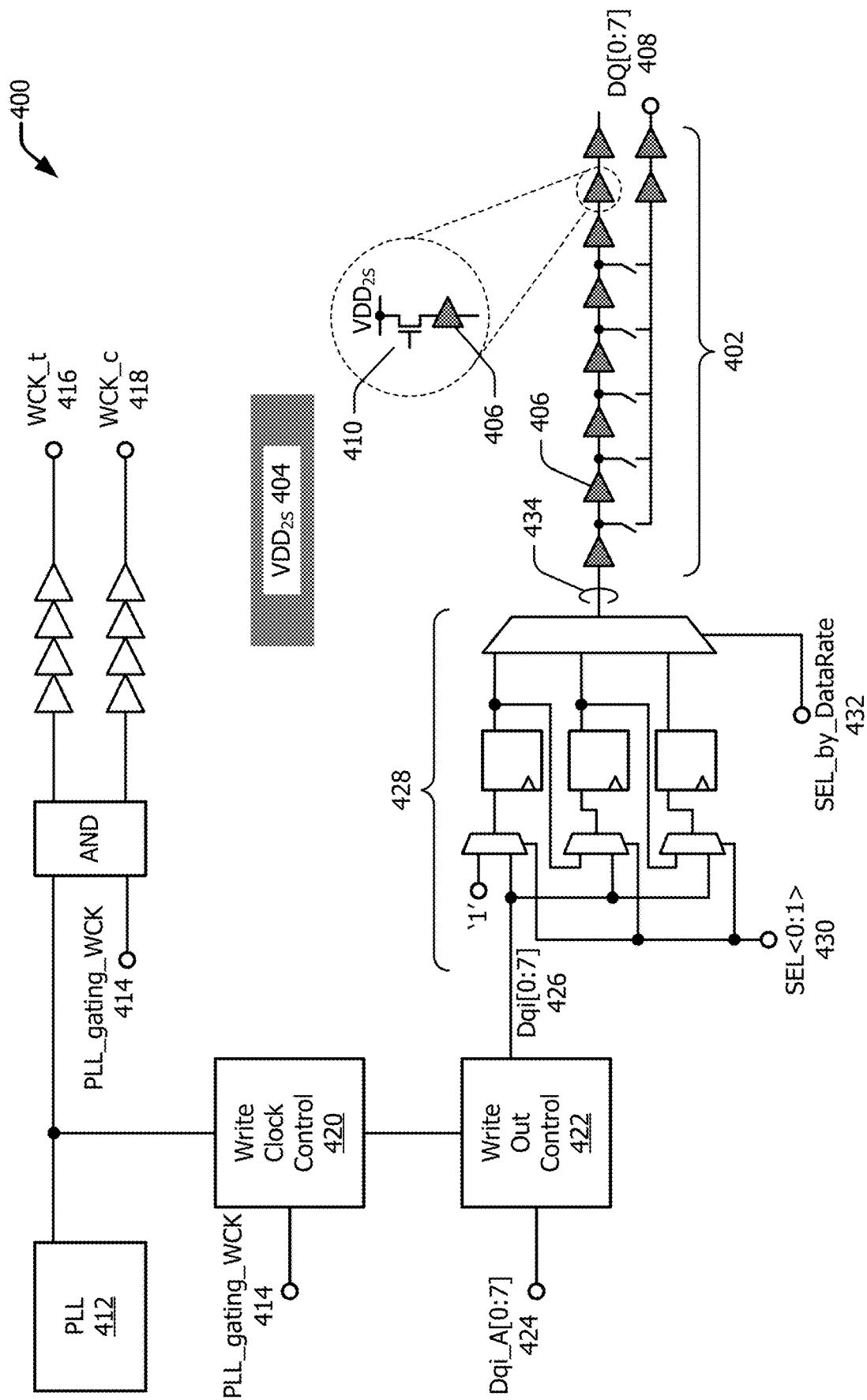
FIG. 4 illustrates an example write timing compensation circuit that includes components powered in accordance with aspects of multi-rail power transition.

FIG. 4 illustrates at 400 an example a write timing compensation circuit that includes components powered in accordance with aspects of multi-rail power transition. Generally, when the memory controller 108 changes operating frequency of the memory device 116 from a first frequency to a second frequency, the memory controller 108 also transitions (e.g., ramps) an operating voltage of the memory device 116 from a first voltage to a second voltage. This transition of from one operating voltage to another can affect signal timing margins or write eye patterns (e.g., FIG. 10), which may result in impaired or suspended memory performance while the voltage is transitioned. Aspects of write timing compensation, which may be included with or combined with aspects of multi-rail power transition, can address these and other signal timing issues by incorporating the dynamic power rail or speed path rail into write timing compensation circuitry of the memory controller 108 and/or the memory device 116. Because the memory controller 108 and memory device 116 are formed using different fabrication processes, the memory controller 108 may provide speed path power and/or tune portions of the write timing compensation circuit independently from one another (e.g., voltage or timing compensation settings of the memory controller 108 and memory device 116 may differ).

As described with reference to FIG. 3, a memory controller 108 may be include an instance of a PMIC 126 and a PDN 202 to provide a static power rail 204 or a dynamic power rail 206 for powering circuitry of the memory controller 108. As shown at 400, some components of a write timing compensation circuit 402 may receive power from a dynamic power rail or speed path voltage rail 404 ($VDD_{2S}$ 404). In aspects of multi-rail power transition for memory circuits, powering one or more buffers 406 of data signal lines DQ[0:7] 408 using a dynamic power rail 206 or speed path voltage rail 404 that is configured similar to a corresponding dynamic power rail 206 of the memory device 116 may improve signal integrity of data signaling between the memory controller 108 and the memory device 116. As shown, a buffer 406 of the data signal line buffering circuitry is coupled to the speed path voltage rail 404 through a switch element 410 that may be operated by the memory controller 108 or power rail controller 110 to enable operation of the buffer 406 from the dynamic power rail 206 or transition the buffer 406 from a static power rail 204 to a dynamic power rail 206 (e.g., speed path voltage rail 404).

Figure 5A:
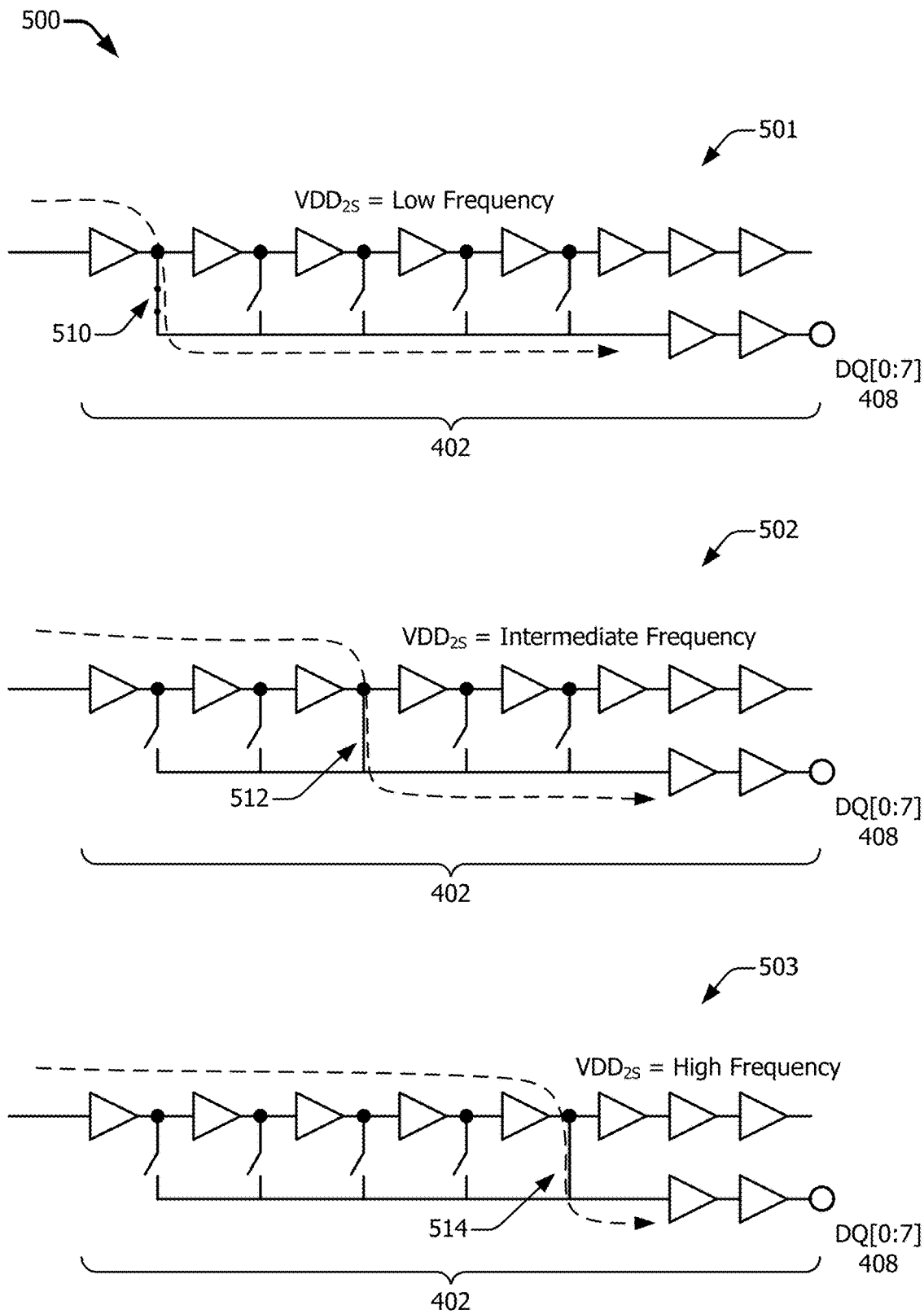
FIGS. 5A and 5B illustrate examples of write timing compensation in accordance with one or more aspects.
Figure 5B:
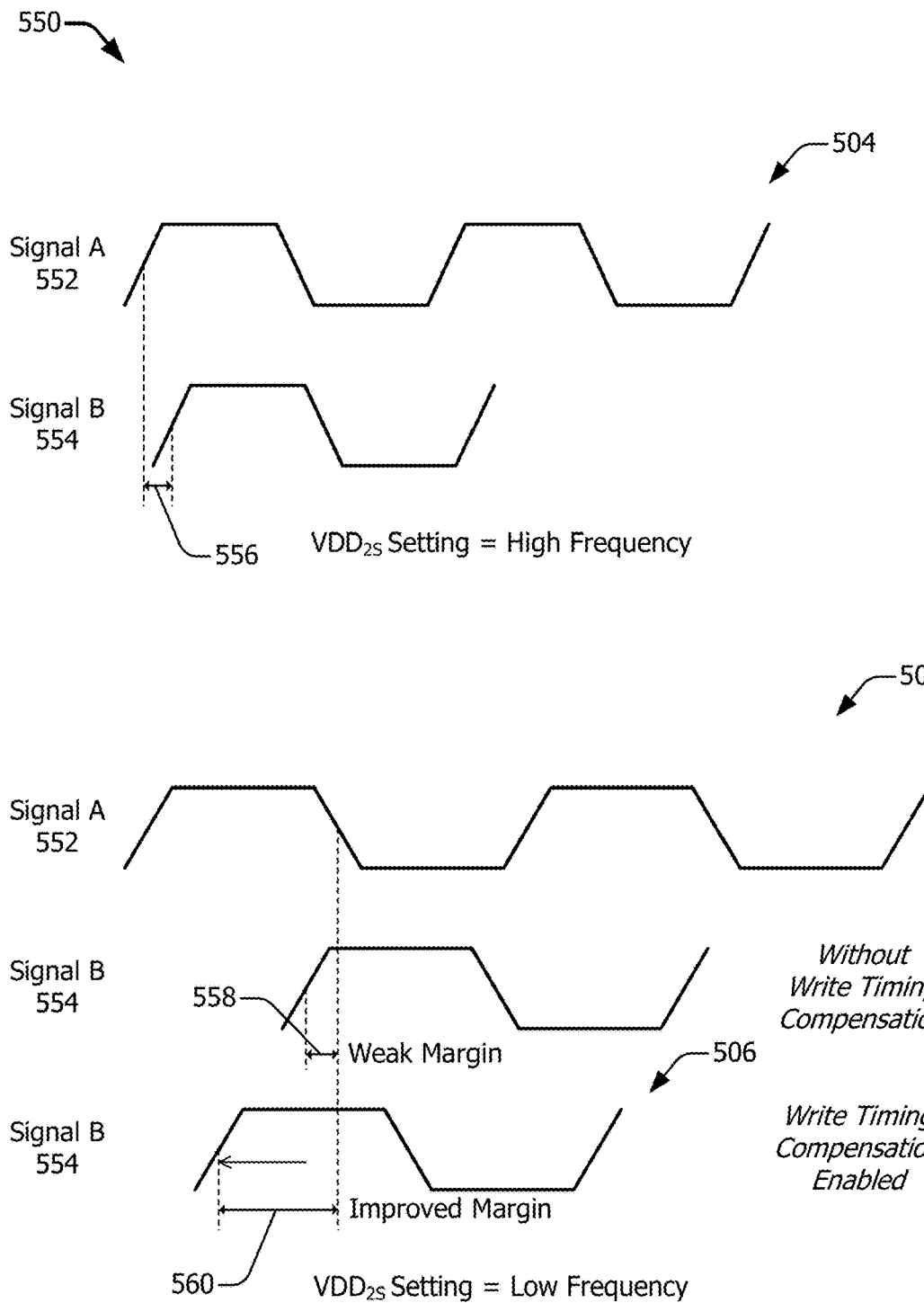

In the example of FIG. 4, the write timing compensation circuit 402 is illustrated in the context of write path circuitry of the memory controller 108. A phase-locked loop 412 provides a source clock signal for generating a write clock and data DQ signaling for transmission to the memory device 116. For example, the output of the PLL 412 is provided to an AND gate with a PLL write clock gating signal 414 (PLL_gating_WCK), which controls generation of a true write clock signal 416 (WCK_t 416) and a complement write clock signal 418 (WCK_c 418) for transferring write data to the memory device 116. The PLL write clock gating signal 414 also gates a write control block 420 to control gating of the source clock signal to a write out control block 422 of the write path circuitry. The write out control block 422 receives data words 424 (DqiA[0:7] 424) and provides clocked data words 426 (Dqi[0:7] 426) to a multiplexed data register circuit 428 (e.g., a digital-to-analog block (DAC block)) that is controlled by a multiplexor selection signal 430 (SEL<0:1>) and a data rate selection signal 432 (SEL_by_DataRate 432) provided by the memory controller 108. Based on the data rate selection and source clock signal of the write circuit, the multiplexed data register circuit 428 provides an analog input data signal (DQ) 434 to the write compensation circuit 402, which may apply tuning or compensation to improve signal integrity of the DQ signals 408 transmitted to the memory device 116. In aspects, the write timing compensator 112 of the memory controller 108 may compensate, tune, or adjust the DQ signals 408 based on one or more parameters of memory operation. For example, the write timing compensator 112 may tune or delay the DQ signals 408 based on a read latency, an operating frequency of the write clock or memory device 116, a selected power rail of the memory device 116, an operating voltage of the memory device 116, mode register settings (e.g., MR_A or MR_B for memory circuit power and/or frequency settings), or any suitable combination thereof. FIGS. 5A and 5B illustrate a portion of the write timing compensation circuit in detail.

FIGS. 5A and 5B illustrate examples of write timing compensation in accordance with one or more aspects. With reference to FIG. 5A, an example write timing compensation circuit 402 is shown generally at 500, with different circuit configurations shown at 501, 502, and 503 for low frequency memory operation, intermediate frequency memory operation, and high frequency memory operation, respectively. In aspects, the memory controller 108 can configure the write timing compensation circuit 402 based on an operating voltage of a memory circuit (e.g., memory die 122 or memory array 124) and/or an operating frequency of the memory circuit. In some cases, the memory controller 108 configures buffers (e.g., a set of multiple buffers) or other delay circuitry of the write timing compensation circuit 402 based on a mode register (MR) information and read latency (RL) information associated with a respective operating configuration for the memory circuit (e.g., operating voltage and frequency).

In the context of 501, for low frequency operation (e.g., 3.2 Gbps) the memory controller may reduce a voltage of the speed path voltage rail (e.g., dynamic power rail 206) to a lower operating voltage (e.g., 0.9V). Based on MR information (MR_A or MR_B) and read latency information for low frequency operation, the memory controller 108 activates a first switch 510 to bypass at least some of the multiple buffers or delay components of the write timing compensation circuit 402, thereby reducing delay of the DQ signals 408 or applying a lesser amount of delay to the DQ signals 408. Thus, for low frequency memory operation, the memory controller 108 may configure or tune the write timing compensation circuit 402 to reduce an amount of delay on the DQ signals 408 sent to the memory device 116.

For an intermediate operating frequency (6.4 Gbps) as shown at 502, the memory controller may increase (from low frequency configuration) or reduce (from high frequency configuration) the voltage of the speed path voltage rail (e.g., dynamic power rail 206) to an intermediate operating voltage (e.g., 0.95V). Based on updated MR information and RL information for intermediate frequency operation, the memory controller 108 activates a second switch 512 (and opens the first switch 510) to use some of the buffers or delay components and bypass at least some of the other buffers or delay components of the write timing compensation circuit 402, thereby increasing or reducing delay of the DQ signals 408 or applying an intermediate amount of delay to the DQ signals. Thus, for intermediate frequency memory operation, the memory controller 108 may configure or tune the write timing compensation circuit 402 to apply an intermediate amount of delay to the DQ signals 408 send to the memory device 116.

In the context of 503, for high frequency operation (e.g., 12.8 Gbps) the memory controller may increase a voltage of the speed path voltage rail to a higher operating voltage (e.g., 1.05 V). Based on MR information and read latency information for high frequency operation, the memory controller 108 activates a third switch 514 to use additional or a majority of the multiple buffers or delay components of the write timing compensation circuit 402, thereby increasing delay of the DQ signals 408 or applying an increased amount of delay to the DQ signals 408. Thus, for high frequency memory operation, the memory controller 108 may configure or tune the write timing compensation circuit 402 to increase an amount of delay on the DQ signals 408 sent to the memory device 116. As described herein, a switch or switch device may comprise any of a transmission gate, a field-effect transistor (FET), a metal-oxide-semiconductor field-effect transistor (MOSFET), pass-transistor logic, a diode, a transistor, or the like.

By way of example, consider timing diagrams shown at 550 of FIG. 5B, which include a signal timing diagram 504 for high frequency operation of a memory device and a signal timing diagram 505 for low frequency operation of a memory device. At 504, signal A 552 lags signal B 554 by a relatively small amount, resulting in an acceptable signaling margin point 556 for the signals as received by the memory device. Here, assume that the memory controller 108 tunes the write timing compensation circuit 402 to reduce an amount of delay applied to signal B 554 (e.g., a DQ signal). For low frequency operation at a lower frequency and voltage, however, as shown at 505 signal A 552 may lag signal B 554 by a larger amount, resulting in a weak signaling margin 558 without write timing compensation enabled. In contrast, with write timing compensation enabled at 506, the memory controller 108 tunes the write timing compensation circuit 402 to increase an amount of delay applied to signal B 554 (e.g., a DQ signal), which results in an improved signaling margin 560 for the signals as received by the memory device. Some aspects of write timing compensation that a memory device may implement are described in detail with reference to FIG. 6.

Figure 6:
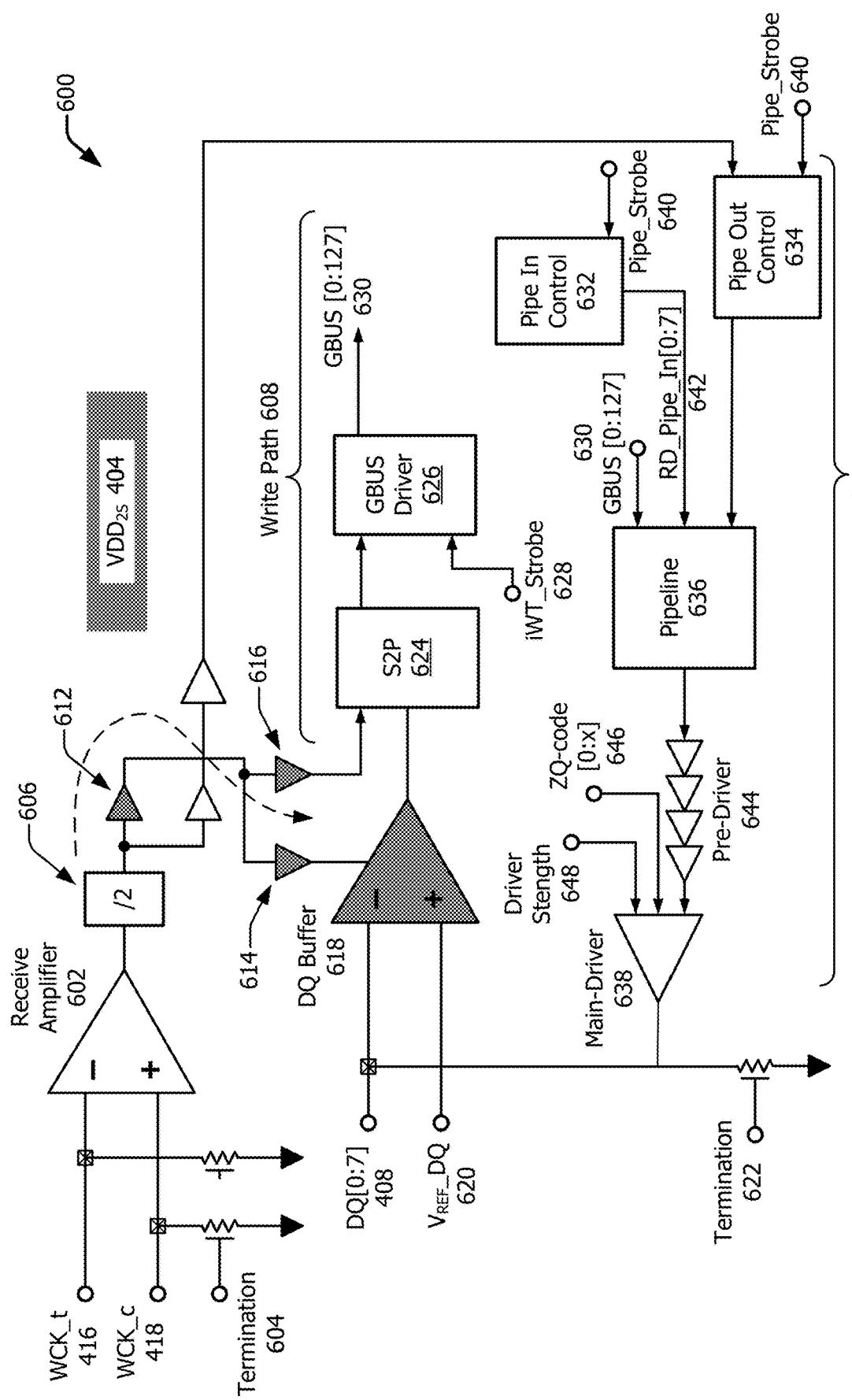
FIG. 6 illustrates an example control circuit for a write path and a read path that is implemented in accordance with one or more aspects.

FIG. 6 illustrates at 600 an example control circuit for a write path and a read path that is implemented in accordance with one or more aspects. The control circuitry in 600 can be implemented in a memory device 116 and may include one or more registers, array control logic, clock circuitry, that enables synchronization of various memory components with one or more clock signals received from the memory controller 108. In this example, the example control circuitry includes receive amplifier 602 for true and complement write clock signals 416 and 418 that are received from the memory controller 108, which can be used to enable write operations to one or more memory dies 122 of the memory device 116. The control circuitry also includes a termination 604 for the write clock signals that may be configured as one or more on-die-terminations that are controllable by the memory controller 108 to apply different termination impedances to the true and complement write clock lines. The receive amplifier 602 (e.g., input buffer) provides a write clock signal to a divider 608, from which the write clock signal is sent to respective components of a write path 608 and a read path 610 of the control circuitry.

In aspects of write timing compensation, one or more components of the write clock receive circuitry, write path 608, and/or read path 610 may be powered from a speed path voltage rail or dynamic power rail. Thus, the control circuitry of the memory device 116 may be powered from a dynamic power rail 206 that also powers a memory die 122 or memory array 124 to which the memory controller 108 writes data using the DQ signals 408. As shown at 600, a buffer 612, a buffer 614, and a buffer 616, as well as a data buffer 618 (DQ buffer 618) are operably coupled to the speed path voltage rail (e.g., dynamic power rail 206), which can provide power to these components at a similar voltage at which the memory die 122 or memory array 124 operates in accordance with one or more aspects. The buffer 612, buffer 614, or buffer 616 may include any suitable signal buffer or driver that is configured to propagate the write clock signal or a derivative clock signal at logic levels based on the speed path voltage rail 404.

Operating from the speed path voltage rail 404, the data buffer 618 receives the data signals 408 from the memory controller 108 based on a data signal reference voltage 620. In some cases, the memory controller 108 can also configure a termination circuit 622 for the data signals 408 with a selected impedance to improve signal quality at the data buffer 618. Here, note that both a transmitter circuit of the data signals 408 (e.g., write timing compensation circuit 402 of the memory controller 108) and a receiver circuit of the data signals 408 (e.g., data buffer of the memory device 116) may operate from a speed path voltage rail or dynamic power rail of the memory system. By so doing, signal integrity of the data signals may be maintained or improved, particularly with changing operating frequency of a memory die or ramping operating voltages to enable power savings or adjust performance of the memory device. From the data buffer 618, the control circuitry provides the data signals 408 from the data buffer 618 to components of the write path 608. In this example, the data signals 408 are provided to a serial-to-parallel block 624 and bank group bus driver 626 (GBUS driver 626) that is clocked by a write strobe 628 (iWT_strobe 628) to provide GBUS data 630 (GBUS [0:127] 630) for writing to the memory die 122 or memory array 124 of the memory device 116.

Aspects of timing compensation may also be implemented in association with data read operations of data from the memory device 116 to the memory controller 108. For example, when the memory controller 108 (e.g., SoC) receives data from the memory device 116, transitions of the dynamic power rail 206 can delay read data timing when reducing operating voltage of the memory or pull in the read data timing when increasing the operating voltage of the memory. To address these or other issues, aspects of timing compensation may include providing power receiver circuitry (e.g., read path) of the memory controller 108 using the dynamic power rail and/or providing power to transmitter circuitry (e.g., write path) of the memory device 116. For example, a DQ data receive circuit of the memory controller 108 may be configured similar to the clock receive and write path of the memory device 116, with a receive amplifier, line drivers, or a DQ buffer configured to operate from a dynamic power rail. Alternatively or additionally, the memory controller 108 may use read data strobe signals provided by the memory device 116 to receive the read data (e.g. DQ data). In aspects, the memory device 116 may generate the DQ data and RDQS signals using the speed path voltage rail or dynamic power rail, such that when DQ data shifts, the RDQS signals also shift a similar or proportional amount. Thus, a received by the memory controller 108, a signal timing relationship between the DQ data and RDQS signals transmitted by the memory device 116 are maintained with an acceptable amount of margin to enable data read operations over a range of multiple voltages (e.g., dynamic power rail or speed path voltages).

With reference to the read path 610, one or more of the read path components may receive (not shown) power from the speed path voltage rail 404. In this example, the read path 610 includes a pipe in control block 632, a pipe out control block 634, a pipeline 636, and a main-driver 638. In accordance with one or more aspects, any these components may be configured (e.g. through a switch element) to selectively operate from the speed path voltage rail 404 or dynamic power rail 206. To enable read operations or transfers of data from the memory device 116 to the memory controller 108, the pipe out control block 640 may operate based on the write clock signal and a pipe strobe signal 640 (pipe strobe 640) provided by the core of the memory device 116. The pipe in control block 632 may also operate based on the pipe strobe signal 640 to provide read pipe in signals 642 (RD Pipe In [0:7] 642) to the pipeline 636, which also receives read data from the memory circuits (e.g., memory die 122) through the bank group bus 630.

The output of the pipeline 636 is coupled to the main-driver 638 by a pre-driver 644, which may also operate from a dynamic power rail 206 in accordance with various aspects. The main-driver 638 provides DQ signals 408 for read operations based on read data provided by the pipeline 636, data line impedance settings 646 (ZQ-code 646), and driver strength settings 648. Generally, the memory controller 108 can configure the data line impedance settings 646 and/or driver strength settings 648 based on an operating configuration of the memory device 116 for data read operations. The write path 608 and read path 610 of the control circuitry may represent respective non-limiting examples in which control circuitry may be configured to implement various aspects write timing compensation or read timing compensation. As such, control circuitry of a memory controller 108 (e.g., SoC) or memory device 116 (e.g., DRAM module) may be implemented with similar or different circuit configurations to implement one or more aspects described herein.

FIGS. 7A-9B illustrate various examples of multi-rail power transitions that a memory controller 108 may implement to use multiple power rails to transition a memory device 116 from one operating voltage to another operating voltage, which may enable power savings by the memory device or adjust performance of the memory device. In aspects, the memory controller 108 may set or adjust one or more operating parameters of the memory device 116 described in reference to the operations of FIGS. 7A-9B, which may include signal line termination settings, an operating frequency of the memory device (e.g., write clock frequency), couplings or connections to a specific power rail (e.g., static power rail 204 or dynamic power rail 206), or a voltage setting of a power rail (e.g., dynamic power rail 206 or speed path voltage rail).

To do so, the memory controller 108 may issue respective mode register commands (MR commands) to change termination settings, couple or decouple power rails, adjust power rail voltage, or the like. As such, the memory controller 108 may implement one or more of the operations described with reference to FIGS. 7A-9B by issuing MR commands or selectively setting MR information (e.g., MR_A or MR_B registers) in the mode register 118 of the memory device 116. Generally, the operations of FIGS. 7A and 7B may be implemented similar to operations described with reference to FIGS. 8A and 8B or FIGS. 9A and 9B. Further, the example voltage, frequency, bandwidth, time, latency, or similar values shown or described with reference to FIGS. 7A-9B FIGS. are present as non-limiting examples, with the general aspects described being applicable to a wide range of memory operating parameters to enable memory operation with improved reliability, increased performance, reduced power consumption, and so forth.

Figure 7A:
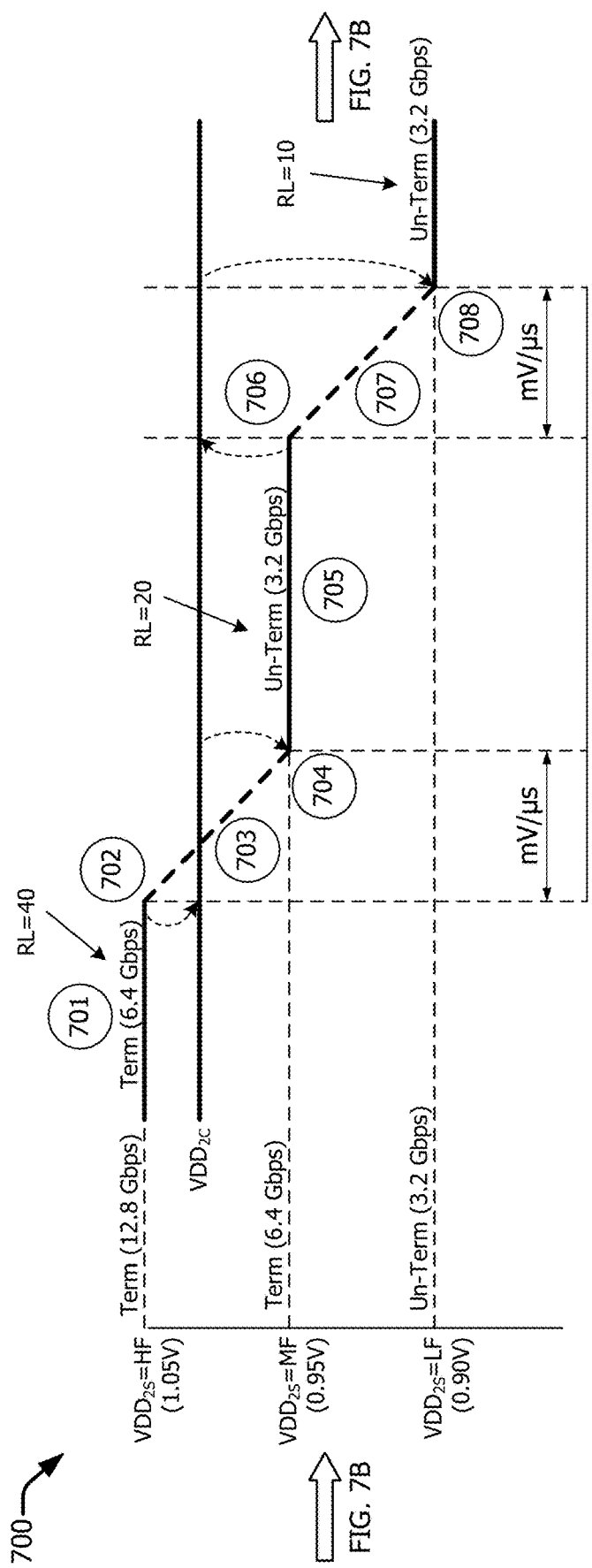
FIGS. 7A and 7B illustrate a first example of multi-rail power transition implemented in accordance with one or more aspects.
Figure 7B:
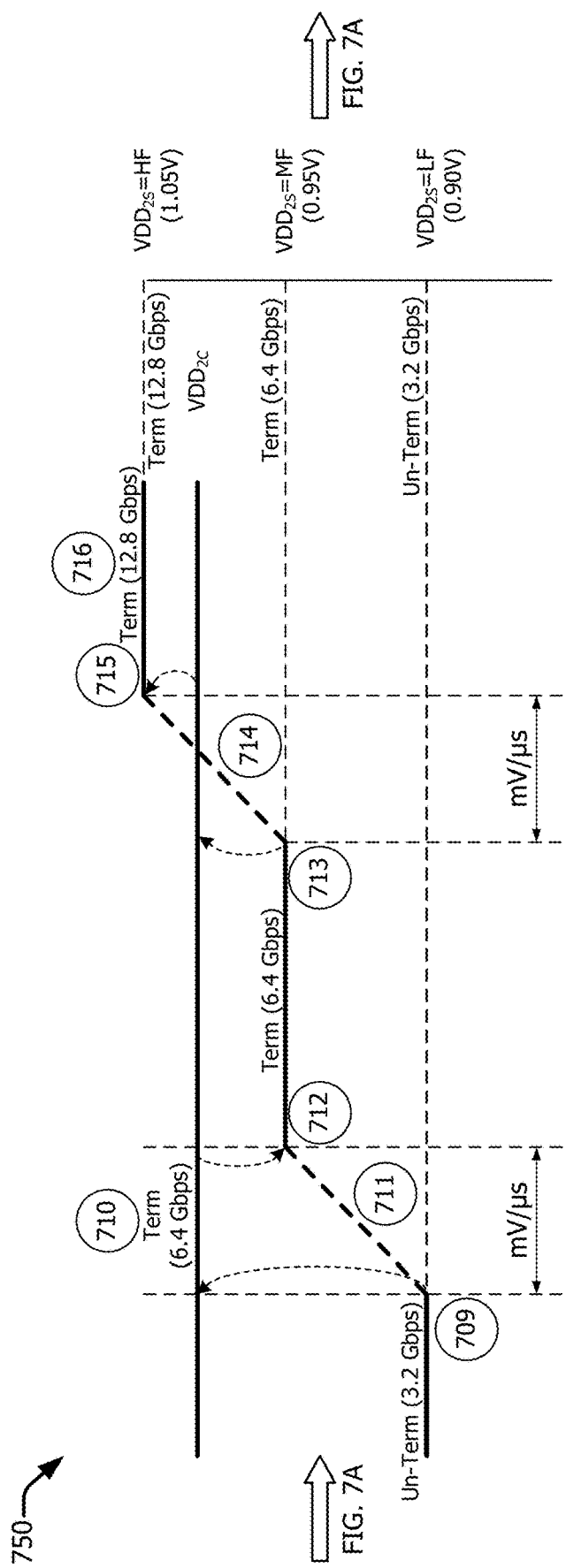

FIGS. 7A and 7B illustrate a first example of multi-rail power transition implemented in accordance with one or more aspects. In this example of multi-rail power transition, a voltage of a core path voltage rail ((VDD$_{2C}$), e.g., static power rail 204) is approximately a voltage of a speed path voltage rail ((VDD$_{2S}$), e.g., dynamic power rail 206) set for high frequency operation of a memory circuit (e.g., memory die or memory array). As shown at 700, assume a memory circuit of a memory device is operating from the speed path voltage rail with a bandwidth of 12.8 Gbps and the memory controller determines to operate the memory circuit with a bandwidth of 6.4 Gbps.

At 701, the memory controller changes (e.g., reduces) an operating frequency of the memory device (e.g., write clock frequency) to support 6.4 Gbps bandwidth operation and may also configure a termination circuit of the memory circuit for signaling at the changed operating frequency (e.g., Term 6.4 Gbps). Alternatively or additionally, the memory controller can configure a write timing compensation circuit based on a latency (e.g., read latency (RL)=10 or a write latency (WL)) that corresponds a current or next set of operating parameters of the memory circuit (e.g., speed grade, operating voltage, termination impedance, etc.). In some cases, a core or control circuit of the memory device may use the latency or the current or next set of operating parameters to adjust internal clock or timing circuitry to compensate for shifts in signal timing related to changes in the operating frequency or operating voltage of the memory circuit.

At 702, the memory controller transitions the memory circuit from the speed path voltage rail to the core path voltage rail from which the memory circuit operates while the memory controller changes an operating voltage of the speed path voltage rail at 703. For example, the memory controller can issue an MR_A command when to transition the memory circuit from the speed path power rail to the core path power rail. In some cases, a specific amount of time (e.g., transition time A) is consumed or lapses while the transition from the speed path voltage rail to the core path voltage rail occurs. In aspects, the memory controller may measure this amount of time, which may be used to gate, delay, or schedule other multi-rail power transition operations, which may include changing memory circuit operating parameters (e.g., frequency or termination settings).

While transitioning the voltage of the speed path voltage rail, the memory circuit can operate from the core path voltage rail (e.g., static power rail). During this time, access to the memory circuit is maintained, such that the memory controller may continue to read data from or write data to the memory circuit (e.g., memory array or memory banks) on the core path voltage rail while the operating voltage of the speed path voltage rail is altered or reconfigured. Thus, after completing transition of the memory circuit from the speed path voltage rail to the core path voltage rail, a PMIC of the memory controller and/or a PMIC of the memory device can begin to ramp the operating voltage of the speed path voltage rail down from VDD$_{2S}$ high frequency (HF, 1.05 V) to VDD$_{2S}$ medium frequency (MF, 0.95V) which is target value of VDD$_{2S}$ for 6.4 Gbps in this example.

At 704, after ramping down the operating voltage of the speed path power rail, the memory controller transitions the memory circuit from the core path power rail to the speed path power rail to operate at the adjusted voltage. For example, after completing the ramp down of the VDD$_{2S}$ rail, the memory controller can issue an MR_B command to transition the memory circuit from $VDD_{2C}$ to $VDD_{2S}$. In some cases, another specific amount of time (e.g., transition time B) is consumed or lapses while the transition from the core path voltage rail to the speed path voltage rail occurs, which may be different from the time consumed by the transition from the speed path voltage rail to the core path voltage rail. The memory controller may also use this amount of time to gate, delay, or schedule other multi-rail power transition operations to ensure continued access to the memory circuit.

When the memory controller determines to operate the memory circuit with a bandwidth of 3.2 Gbps (or 4.266 Gbps), the memory controller may implement similar operations (e.g., operations 701-704) to transition the memory circuit to a lower operating voltage. As shown at 705, the memory controller changes (e.g., reduces) an operating frequency of the memory device to support 3.2 Gbps bandwidth operation and may also configure a termination circuit of the memory circuit for signaling at the changed operating frequency (e.g., Term 3.2 Gbps). Alternatively or additionally, the memory controller can configure the write timing compensation circuit based on a latency (e.g., read latency (RL)=20 or a write latency (WL)) that corresponds a current or next set of operating parameters of the memory circuit. In some cases, the core or control circuit of the memory device may use the latency or the current or next set of operating parameters to adjust internal clock or timing circuitry to compensate for shifts in signal timing related to changes in the operating frequency or operating voltage of the memory circuit.

At 706, the memory controller transitions the memory circuit from the speed path voltage rail to the core path voltage rail from which the memory circuit operates while the memory controller changes an operating voltage of the speed path voltage rail at 707 to support memory circuit operation for 3.2 Gbps bandwidth. Generally, the memory controller may change or alter the operating voltage of the speed path voltage rail for 3.2 Gbps bandwidth operation in similar fashion as described with reference to operation 703. At 708, after ramping down the operating voltage of the speed path power rail, the memory controller transitions the memory circuit from the core path power rail to the speed path power rail to operate at the adjusted voltage to support memory circuit access with 3.2 Gbps bandwidth. Alternatively or additionally, the memory controller or the control circuit of the memory device may alter write path circuitry based on a latency (e.g., read latency (RL)=10 or a write latency (WL)) that corresponds to the adjusted voltage level of the speed path voltage rail. From any operating configuration of FIG. 7A (e.g., operating at 6.4 Gbps or 3.2 Gbps), the example 700 of multi-rail power transition may proceed or return to FIG. 7B in which example operations may ramp up or increase the operating voltage of the speed path voltage rail.

Generally, FIG. 7B illustrates additional or other operations of multi-rail power transition in a similar context to that of FIG. 7A. As shown at 750, assume the memory circuit of the memory device is operating from the speed path voltage rail with a bandwidth of 3.2 Gbps (or 4.266 Gbps) and the memory controller determines to operate the memory circuit with a bandwidth of 6.4 Gbps. At 709, the memory controller transitions the memory circuit from the speed path voltage rail to the core path voltage rail from which the memory circuit operates. Generally, the memory controller may transition the memory circuit to the core path voltage rail with a higher operating voltage before increasing a frequency of the memory circuit. While the memory circuit is coupled to the core path voltage rail, at 710 the memory controller changes (e.g., increases) an operating frequency of the memory device (e.g., write clock frequency) to support 6.4 Gbps bandwidth operation and may also configure a termination circuit of the memory circuit for signaling at the changed operating frequency (e.g., Term 6.4 Gbps). Alternatively or additionally, the memory controller can configure a write timing compensation circuit based on a latency (e.g., read latency (RL)=20 or a write latency (WL)) that corresponds a current or next set of operating parameters of the memory circuit.

At 711, the memory controller changes (increases) the operating voltage of the speed path voltage rail to support operation of the memory circuit at 6.4 Gbps bandwidth. While transitioning the voltage of the speed path voltage rail, the memory circuit can operate from the core path voltage rail (e.g., static power rail). During this time, access to the memory circuit is maintained, such that the memory controller may continue to read data from or write data to the memory circuit (e.g., memory array or memory banks) on the core path voltage rail while the operating voltage of the speed path voltage rail is altered or reconfigured. At 712, after ramping up the operating voltage of the speed path power rail, the memory controller transitions the memory circuit from the core path power rail to the speed path power rail to operate with 6.4 Gbps bandwidth at the adjusted voltage.

When the memory controller determines to operate the memory circuit with a bandwidth of 12.8 Gbps, the memory controller may implement similar operations (e.g., operations 709-712) to transition the memory circuit to a higher operating voltage. As shown at 713, the memory controller transitions the memory circuit from the speed path voltage rail to the core path voltage rail from which the memory circuit operates while the memory controller changes an operating voltage of the speed path voltage rail at 714 to support memory circuit operation for 12.8 Gbps bandwidth. At 715, after ramping up the operating voltage of the speed path power rail, the memory controller transitions the memory circuit from the core path power rail to the speed path power rail to operate at the adjusted voltage to support memory circuit access with 12.8 Gbps bandwidth. At 716, the memory controller changes (e.g., increases) the operating frequency of the memory device to support 12.8 Gbps bandwidth operation and may also configure a termination circuit of the memory circuit for signaling at the changed operating frequency (e.g., Term 12.8 Gbps). Alternatively or additionally, the memory controller can configure a write timing compensation circuit based on a latency (e.g., read latency (RL)=40 or a write latency (WL)) that corresponds a current or next set of operating parameters of the memory circuit. From any operating configuration of FIG. 7B (e.g., operating at 6.4 Gbps or 12.8 Gbps), the example 750 of multi-rail power transition may proceed or return to FIG. 7A in which various operations may ramp down or decrease the operating voltage of the speed path voltage rail.

Figure 8A:
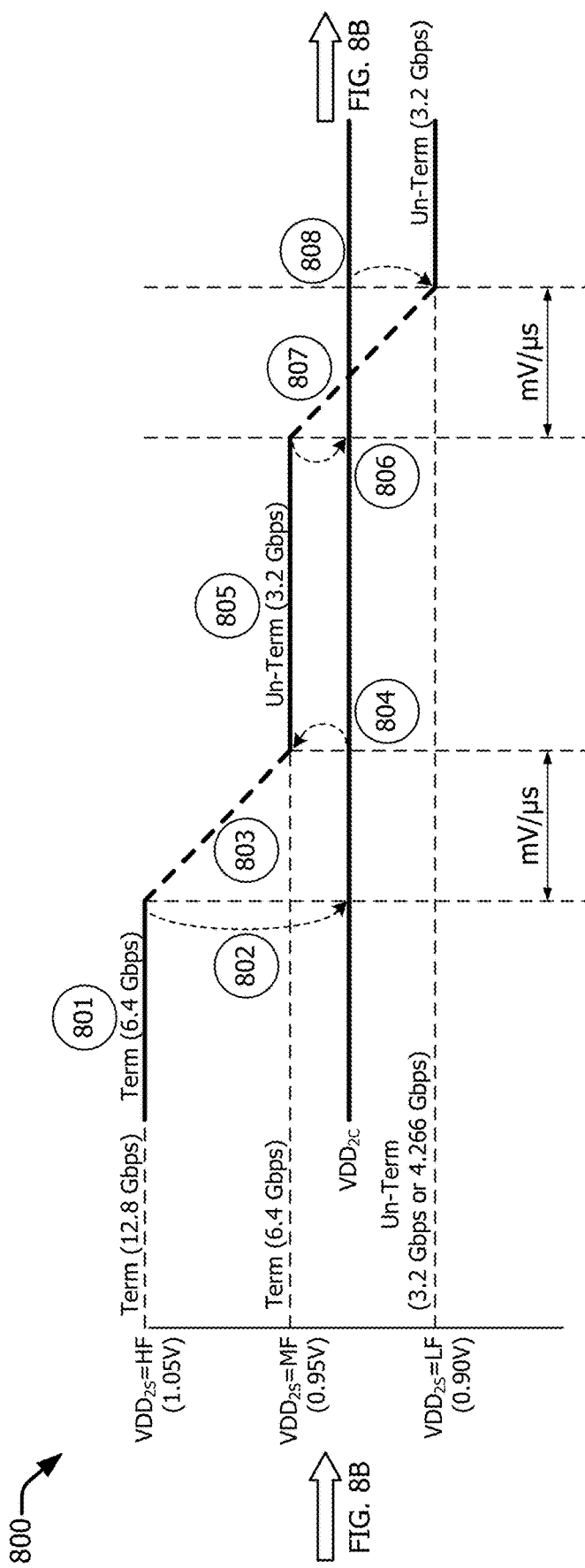
FIGS. 8A and 8B illustrate a second example of multi-rail power transition implemented in accordance with one or more aspects.
Figure 8B:
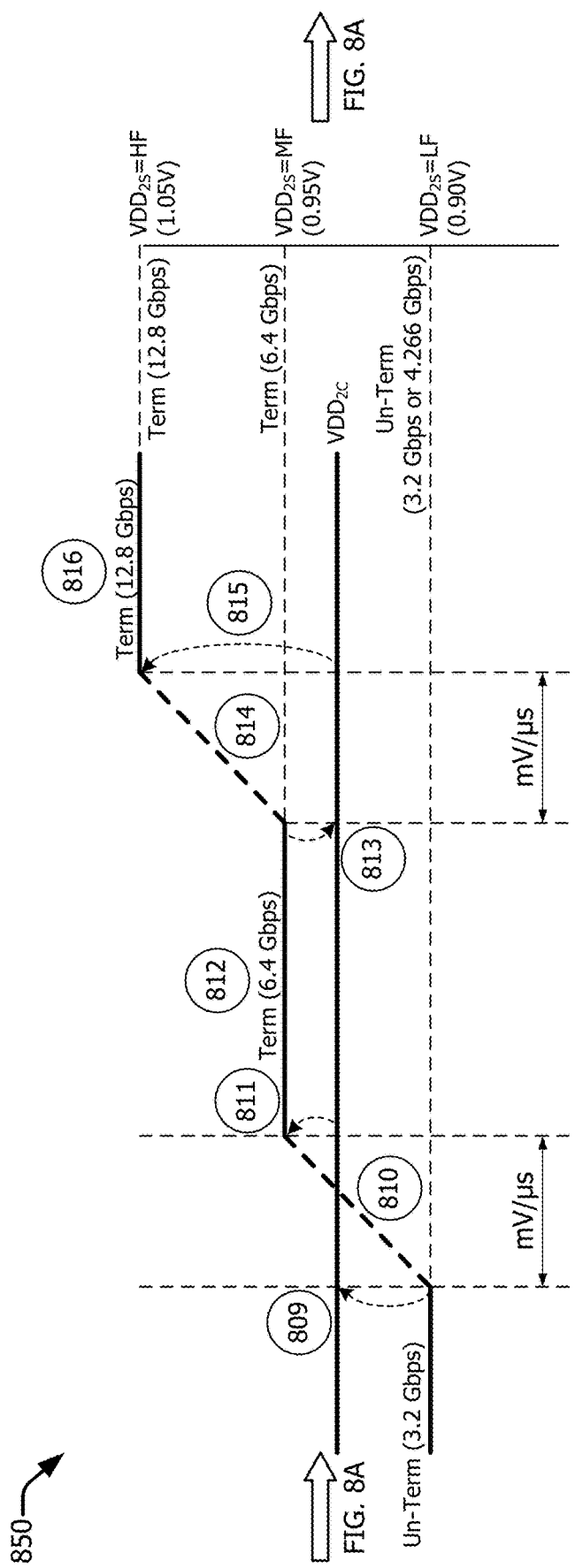

FIGS. 8A and 8B illustrate a second example of multi-rail power transition implemented in accordance with one or more aspects. In this example of multi-rail power transition, a voltage of a core path voltage rail (($VDD_{2C}$), e.g., static power rail 204) is approximately a voltage of a speed path voltage rail (($VDD_{2S}$), e.g., dynamic power rail 206) set for medium frequency operation of a memory circuit (e.g., memory die or memory array). Generally, the operations of FIGS. 8A and 8B may be implemented similar to operations described with reference to FIGS. 7A and 7B or FIGS. 9A and 9B. As shown at 800, assume a memory circuit of a memory device is operating from the speed path voltage rail with a bandwidth of 12.8 Gbps and the memory controller determines to operate the memory circuit with a bandwidth of 6.4 Gbps.

As shown at 801, the memory controller changes (e.g., reduces) an operating frequency of the memory device to support 6.4 Gbps bandwidth operation and may also configure a termination circuit of the memory circuit for signaling at the changed operating frequency (e.g., Term 6.4 Gbps). At 802, the memory controller transitions the memory circuit from the speed path voltage rail to the core path voltage rail from which the memory circuit operates while the memory controller changes an operating voltage of the speed path voltage rail at 803 to support memory circuit operation for 6.4 Gbps bandwidth. Generally, the memory controller may change or alter the operating voltage of the speed path voltage rail for 6.4 Gbps bandwidth operation in similar fashion as described with reference to operation 703. At 804, after ramping down the operating voltage of the speed path power rail, the memory controller transitions the memory circuit from the core path power rail to the speed path power rail to operate at the adjusted voltage to support memory circuit access with 6.4 Gbps bandwidth.

When the memory controller determines to operate the memory circuit with a bandwidth of 3.2 Gbps (or 4.266 Gbps), the memory controller may implement similar operations (e.g., operations 801-804) to transition the memory circuit to a lower operating voltage. As shown at 805, the memory controller changes (e.g., reduces) an operating frequency of the memory device to support 3.2 Gbps bandwidth operation and may also configure a termination circuit of the memory circuit for signaling at the changed operating frequency (e.g., Term 3.2 Gbps). At 806, the memory controller transitions the memory circuit from the speed path voltage rail to the core path voltage rail from which the memory circuit operates while the memory controller changes an operating voltage of the speed path voltage rail at 807 to support memory circuit operation for 3.2 Gbps bandwidth. Generally, the memory controller may change or alter the operating voltage of the speed path voltage rail for 3.2 Gbps bandwidth operation in similar fashion as described with reference to operations 703 or 803. At 808, after ramping down the operating voltage of the speed path power rail, the memory controller transitions the memory circuit from the core path power rail to the speed path power rail to operate at the adjusted voltage to support memory circuit access with 3.2 Gbps bandwidth. From any operating configuration of FIG. 8A (e.g., operating at 6.4 Gbps or 3.2 Gbps), the example 800 of multi-rail power transition may proceed or return to FIG. 8B in which example operations may ramp up or increase the operating voltage of the speed path voltage rail.

Generally, FIG. 8B illustrates additional or other operations of multi-rail power transition in a similar context to that of FIG. 8A in which the core path voltage rail has a voltage approximate or similar to the speed path voltage rail when configured for medium frequency operation. As shown at 850, assume the memory circuit of the memory device is operating from the speed path voltage rail with a bandwidth of 3.2 Gbps (or 4.266 Gbps) and the memory controller determines to operate the memory circuit with a bandwidth of 6.4 Gbps. At 809, the memory controller transitions the memory circuit from the speed path voltage rail to the core path voltage rail from which the memory circuit operates while the memory controller changes (increases) the operating voltage of the speed path voltage rail at 810 to support operation of the memory circuit at 6.4 Gbps bandwidth. While transitioning the voltage of the speed path voltage rail, the memory circuit can operate from the core path voltage rail (e.g., static power rail). At 811, after ramping up the operating voltage of the speed path power rail, the memory controller transitions the memory circuit from the core path power rail to the speed path power rail to support memory operations 6.4 Gbps bandwidth. At 812 and with the increased operating voltage of the speed path voltage rail, the memory controller changes (e.g., increases) an operating frequency of the memory device (e.g., write clock frequency) to support 6.4 Gbps bandwidth operation and may also configure a termination circuit of the memory circuit for signaling at the changed operating frequency (e.g., Term 6.4 Gbps).

When the memory controller determines to operate the memory circuit with a bandwidth of 12.8 Gbps, the memory controller may implement similar operations (e.g., operations 809-812) to transition the memory circuit to a higher operating voltage. As shown at 813, the memory controller transitions the memory circuit from the speed path voltage rail to the core path voltage rail from which the memory circuit operates while the memory controller changes (increases) the operating voltage of the speed path voltage rail at 814 to support operation of the memory circuit at 12.8 Gbps bandwidth. While transitioning the voltage of the speed path voltage rail, the memory circuit can continue to operate from the core path voltage rail (e.g., static power rail). At 815, after ramping up the operating voltage of the speed path power rail, the memory controller transitions the memory circuit from the core path power rail to the speed path power rail to support memory operations 12.8 Gbps bandwidth. At 816 and with the increased operating voltage of the speed path voltage rail, the memory controller changes (e.g., increases) an operating frequency of the memory device (e.g., write clock frequency) to support 12.8 Gbps bandwidth operation and may also configure a termination circuit of the memory circuit for signaling at the changed operating frequency (e.g., Term 12.8 Gbps). From any operating configuration of FIG. 8B (e.g., operating at 6.4 Gbps or 12.8 Gbps), the example 850 of multi-rail power transition may proceed or return to FIG. 8A in which various operations may ramp down or decrease the operating voltage of the speed path voltage rail.

Figure 9A:
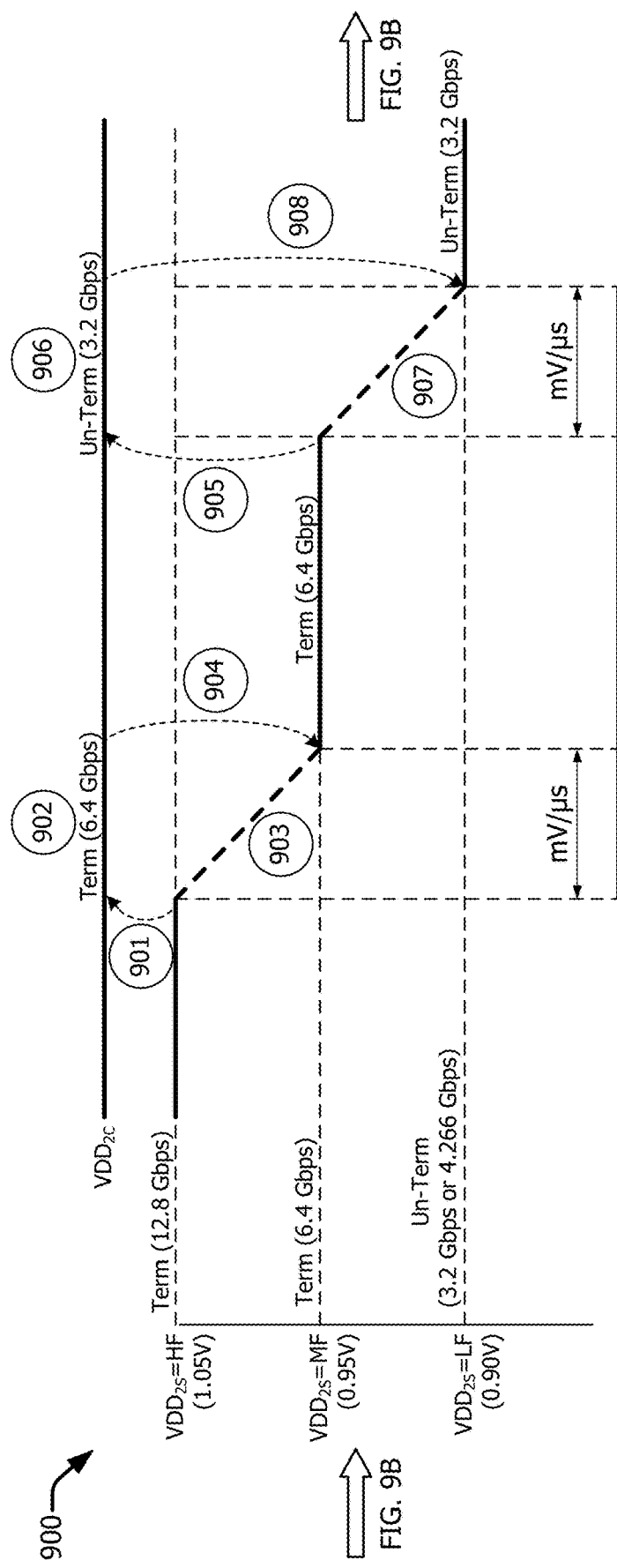
FIGS. 9A and 9B illustrate a third example of multi-rail power transition implemented in accordance with one or more aspects.
Figure 9B:
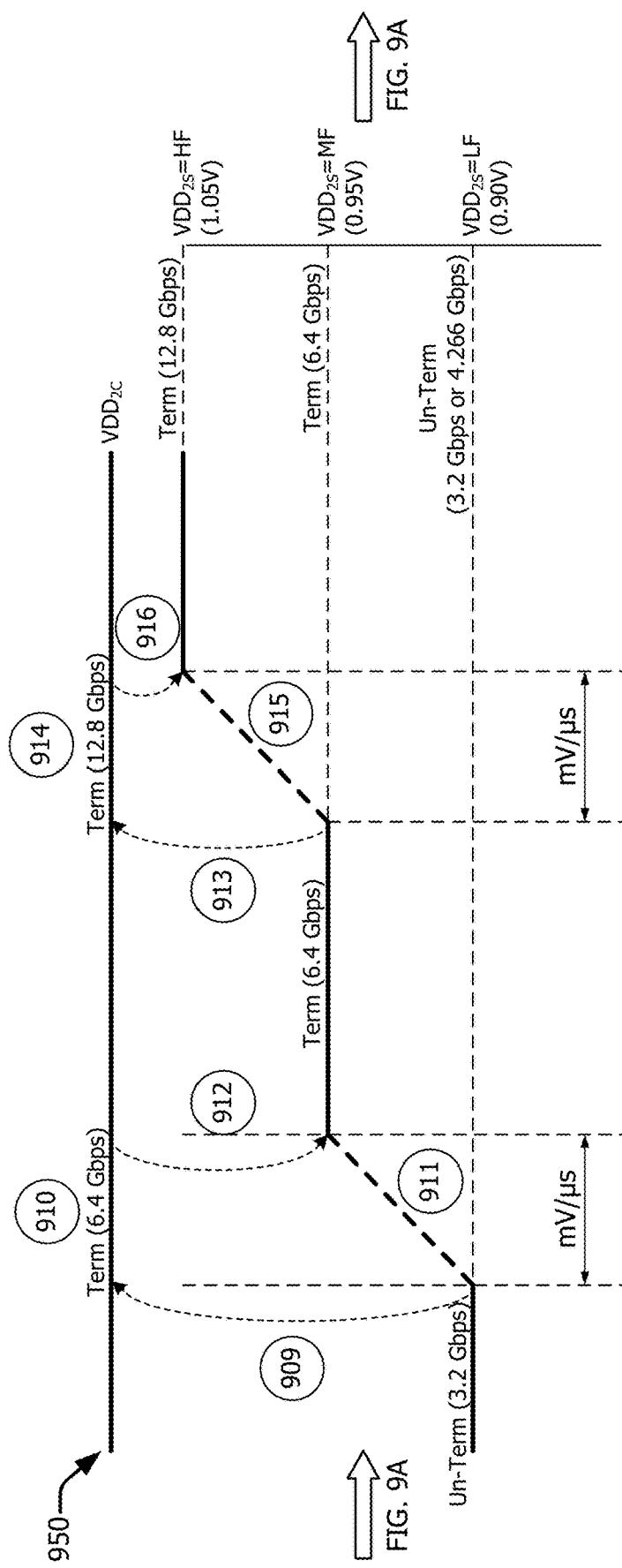

FIGS. 9A and 9B illustrate a third example of multi-rail power transition implemented in accordance with one or more aspects; In this example of multi-rail power transition, a voltage of a core path voltage rail ((VDD$_{2C}$), e.g., static power rail 204) is higher that a voltage of a speed path voltage rail ((VDD$_{2S}$), e.g., dynamic power rail 206) set for high frequency operation of a memory circuit. Generally, the operations of FIGS. 9A and 9B may be implemented similar to operations described with reference to FIGS. 8A and 8B or FIGS. 9A and 9B. As shown at 900, assume a memory circuit of a memory device is operating from the speed path voltage rail with a bandwidth of 12.8 Gbps and the memory controller determines to operate the memory circuit with a bandwidth of 6.4 Gbps.

As shown at 901, the memory controller transitions the memory circuit from the speed path voltage rail to the core path voltage rail from which the memory circuit operates. While the memory circuit is coupled to the core path voltage rail, at 902 the memory controller changes (e.g., decreases) an operating frequency of the memory device (e.g., write clock frequency) to support 6.4 Gbps bandwidth operation and may also configure a termination circuit of the memory circuit for signaling at the changed operating frequency (e.g., Term 6.4 Gbps). At 903, the memory controller changes (decreases) the operating voltage of the speed path voltage rail to support operation of the memory circuit at 6.4 Gbps bandwidth. While transitioning the voltage of the speed path voltage rail, the memory circuit can operate from the core path voltage rail (e.g., static power rail). At 904, after ramping down the operating voltage of the speed path power rail, the memory controller transitions the memory circuit from the core path power rail to the speed path power rail to operate with 6.4 Gbps bandwidth at the adjusted voltage.

When the memory controller determines to operate the memory circuit with a bandwidth of 3.2 Gbps (or 4.266 Gbps), the memory controller may implement similar operations (e.g., operations 901-904) to transition the memory circuit to a lower operating voltage. As shown at 905, the memory controller transitions the memory circuit from the speed path voltage rail to the core path voltage rail from which the memory circuit operates. While the memory circuit is coupled to the core path voltage rail, at 906 the memory controller changes (e.g., decreases) an operating frequency of the memory device (e.g., write clock frequency) to support 3.2 Gbps bandwidth operation and may also configure a termination circuit of the memory circuit for signaling at the changed operating frequency (e.g., Term 3.2 Gbps). At 907, the memory controller changes (decreases) the operating voltage of the speed path voltage rail to support operation of the memory circuit at 3.2 Gbps bandwidth. While transitioning the voltage of the speed path voltage rail, the memory circuit can operate from the core path voltage rail (e.g., static power rail). At 908, after ramping down the operating voltage of the speed path power rail, the memory controller transitions the memory circuit from the core path power rail to the speed path power rail to operate with 3.2 Gbps bandwidth at the adjusted voltage. From any operating configuration of FIG. 9A (e.g., operating at 6.4 Gbps or 3.2 Gbps), the example 900 of multi-rail power transition may proceed or return to FIG. 9B in which example operations may ramp up or increase the operating voltage of the speed path voltage rail.

Generally, FIG. 9B illustrates additional or other operations of multi-rail power transition in a similar context to that of FIG. 9A in which the core path voltage rail has a voltage that is higher that the speed path voltage rail when configured for high frequency operation. As shown at 950, assume the memory circuit of the memory device is operating from the speed path voltage rail with a bandwidth of 3.2 Gbps (or 4.266 Gbps) and the memory controller determines to operate the memory circuit with a bandwidth of 6.4 Gbps. At 909, the memory controller transitions the memory circuit from the speed path voltage rail to the core path voltage rail from which the memory circuit operates. While the memory circuit is coupled to the core path voltage rail, at 910 the memory controller changes (e.g., increases) an operating frequency of the memory device (e.g., write clock frequency) to support 6.4 Gbps bandwidth operation and may also configure a termination circuit of the memory circuit for signaling at the changed operating frequency (e.g., Term 6.4 Gbps). At 911, the memory controller changes (e.g., increases) the operating voltage of the speed path voltage rail to support operation of the memory circuit at 6.4 Gbps bandwidth. While transitioning the voltage of the speed path voltage rail, the memory circuit can operate from the core path voltage rail (e.g., static power rail). At 912, after ramping up the operating voltage of the speed path power rail, the memory controller transitions the memory circuit from the core path power rail to the speed path power rail to operate with 6.4 Gbps bandwidth at the adjusted voltage.

When the memory controller determines to operate the memory circuit with a bandwidth of 12.8 Gbps, the memory controller may implement similar operations (e.g., operations 909-912) to transition the memory circuit to a higher operating voltage. As shown at 913, the memory controller transitions the memory circuit from the speed path voltage rail to the core path voltage rail from which the memory circuit operates. While the memory circuit is coupled to the core path voltage rail, at 914 the memory controller changes (e.g., increases) the operating frequency of the memory device (e.g., write clock frequency) to support 12.8 Gbps bandwidth operation and may also configure a termination circuit of the memory circuit for signaling at the changed operating frequency (e.g., Term 12.8 Gbps). At 915, the memory controller changes (increases) the operating voltage of the speed path voltage rail to support operation of the memory circuit at 12.8 Gbps bandwidth. While transitioning the voltage of the speed path voltage rail, the memory circuit can operate from the core path voltage rail (e.g., static power rail). At 916, after ramping up the operating voltage of the speed path power rail, the memory controller transitions the memory circuit from the core path power rail to the speed path power rail to operate with 12.8 Gbps bandwidth at the adjusted voltage. From any operating configuration of FIG. 9B (e.g., operating at 6.4 Gbps or 12.8 Gbps), the example 950 of multi-rail power transition may proceed or return to FIG. 9A in which various operations may ramp down or decrease the operating voltage of the speed path voltage rail.

Figure 10:
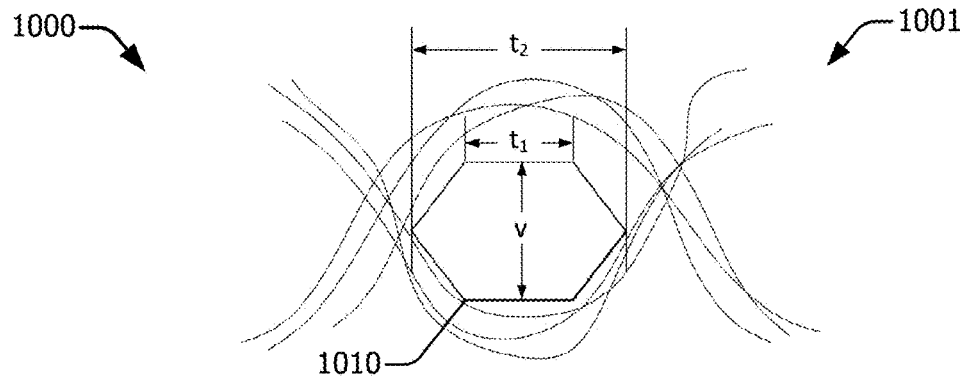
FIG. 10 illustrates example timing diagrams associated with aspects of multi-rail power transition and/or write timing compensation.
Figure 10:
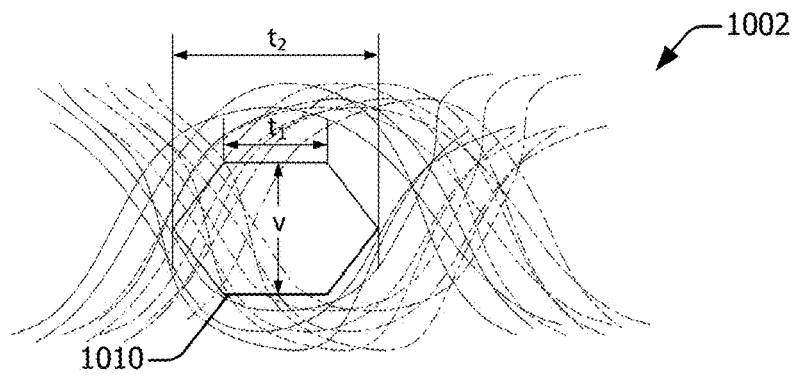
Figure 10:
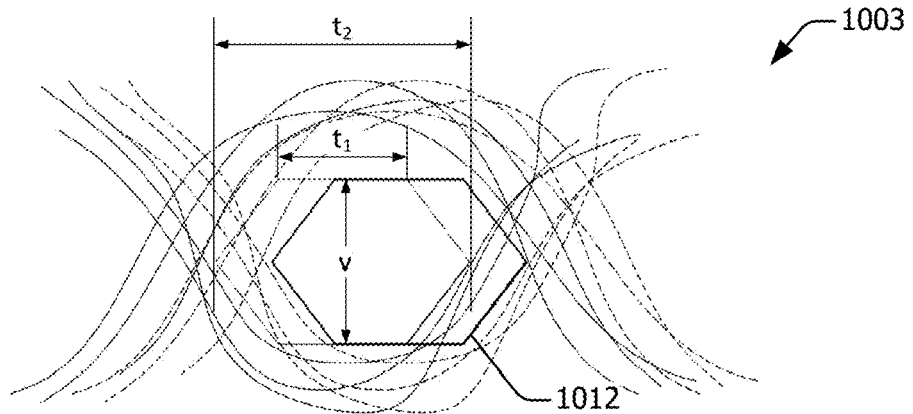

FIG. 10 illustrates at 1100 example timing diagrams associated with multi-rail power transition and/or write timing compensation. The example timing diagrams include signal eye diagrams 1001, 1002, and 1003 that illustrate issues associated with previous techniques of frequency or voltage scaling (e.g., 1002), as well as improved signaling timing (e.g., 1003) enabled by aspects of multi-rail power transition and/or writing timing compensation. By way of example, consider signal eye diagram 1001 that illustrates write data signals of a memory circuit operating from a static power rail 204. As shown at 1001, the write data signals do not violate the timing or voltage constraints of the signal eye template 1010. In contrast, as shown at 1002, when a memory controller 108 transitions (e.g., ramps) an dynamic voltage rail of a memory device directly from a first voltage to a second voltage, the resulting write data signals can violate the timing or voltage constraints of the signal eye template 1010, which may result in write operation failures. As shown at 1003, aspects of multi-rail power transition and/or write timing compensation can address these and other signal timing issues by using a static power rail to transition between operating voltages and/or adjust delay on the write data signals to provide improved write data signaling that substantially satisfies a modified signal eye template 1012. Thus, aspects of multi-rail power transition and/or write timing compensation may enable improved memory performance over a wide range of memory operating frequencies and voltages.

Example Methods

Example methods are described in this section with reference to the flow charts and flow diagrams of FIGS. 11-15. These descriptions reference components, entities, and other aspects depicted in FIGS. 1-10 by way of example only.

Figure 11:
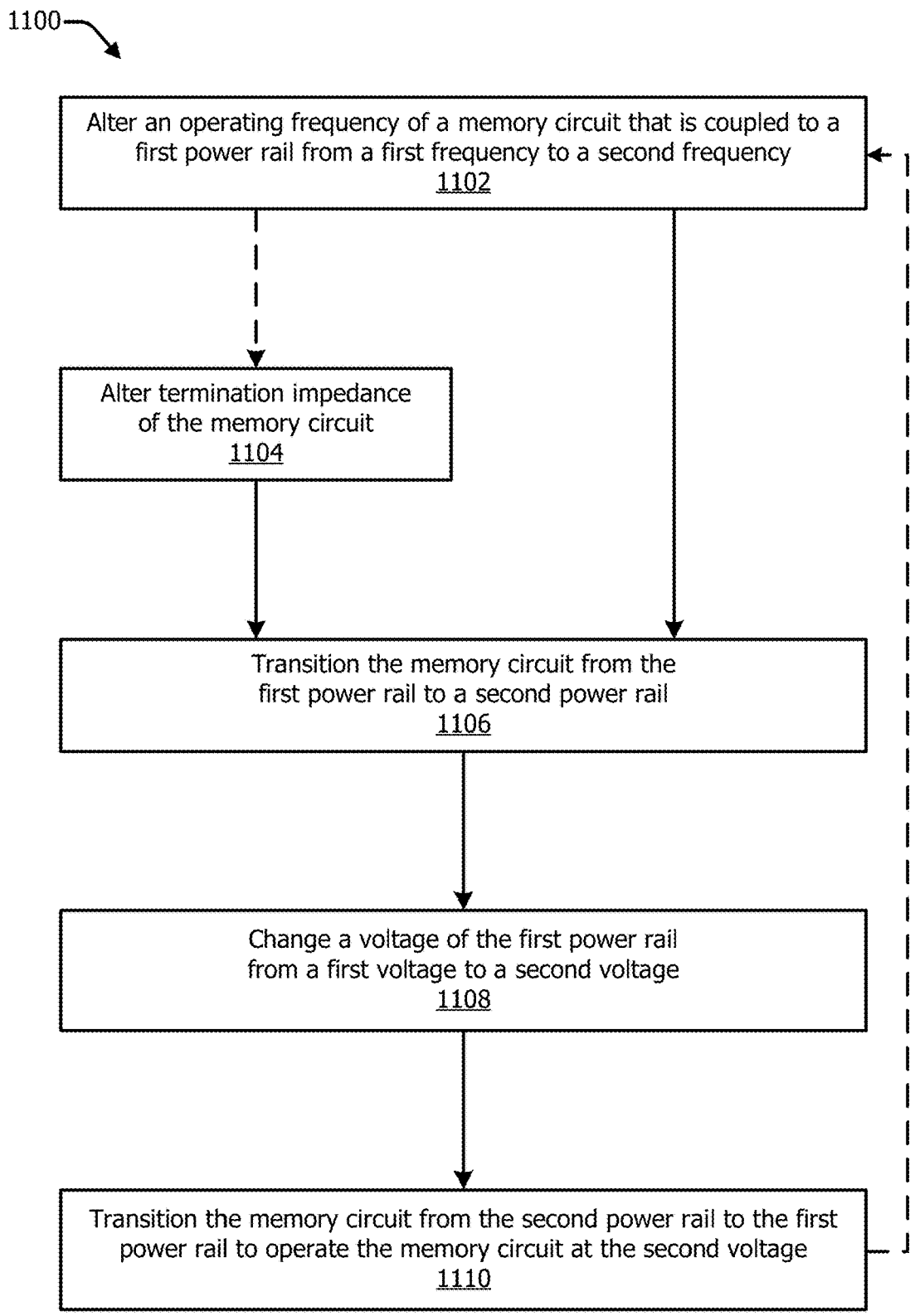
FIG. 11 illustrates an example method for multi-rail power transition for a memory circuit.

FIG. 11 depicts a flow diagram 1100 of an example method for multi-rail power transition. The flow diagram 1100 includes operations 1102 through 1110, which a power rail controller 110 and/or write timing compensator 112 of a memory controller 108 may perform to implement aspects of multi-rail power transition and/or write timing compensation as described herein.

At 1102, a memory controller alters an operating frequency of a memory circuit that is coupled to a first power rail from a first frequency to a second frequency. For example, the memory controller may reduce a frequency of a write clock used by the memory circuit to implement write operations for data received from the memory controller. Optionally at 1104, the memory controller alters a termination impedance of the memory circuit. In some cases, the memory controller alters the termination impedance of clock lines or data signal lines of the memory circuit based on the second frequency selected for operation of the memory circuit.

At 1106, the memory controller transitions the memory circuit from the first power rail to a second power rail. For example, the memory controller can transition the memory circuit from a dynamic power rail to a static power rail, which may include a core path power rail of the memory die or memory device in which the memory circuit is embodied. At 1108, the memory controller changes a voltage of the first power rail from a first voltage to a second voltage. In aspects, the memory controller changes the voltage of the first power rail or a dynamic power rail while the memory circuit operates from the second power rail. By so doing, the memory controller can scale voltage of the dynamic power supply without impairing signal integrity or signal timing of the memory circuit.

At 1110, the memory controller transitions the memory circuit from the second power rail to the first power rail to operate the memory circuit at the second voltage. In aspects, the memory controller transitions the memory circuit from the static power rail back to the dynamic power rail after the dynamic power rail reaches the second voltage as set or configured by the memory controller. The memory circuit may operate from the dynamic power rail at the second voltage to reduce power consumption of the memory circuit or to increase performance of the memory circuit.

Figure 12:
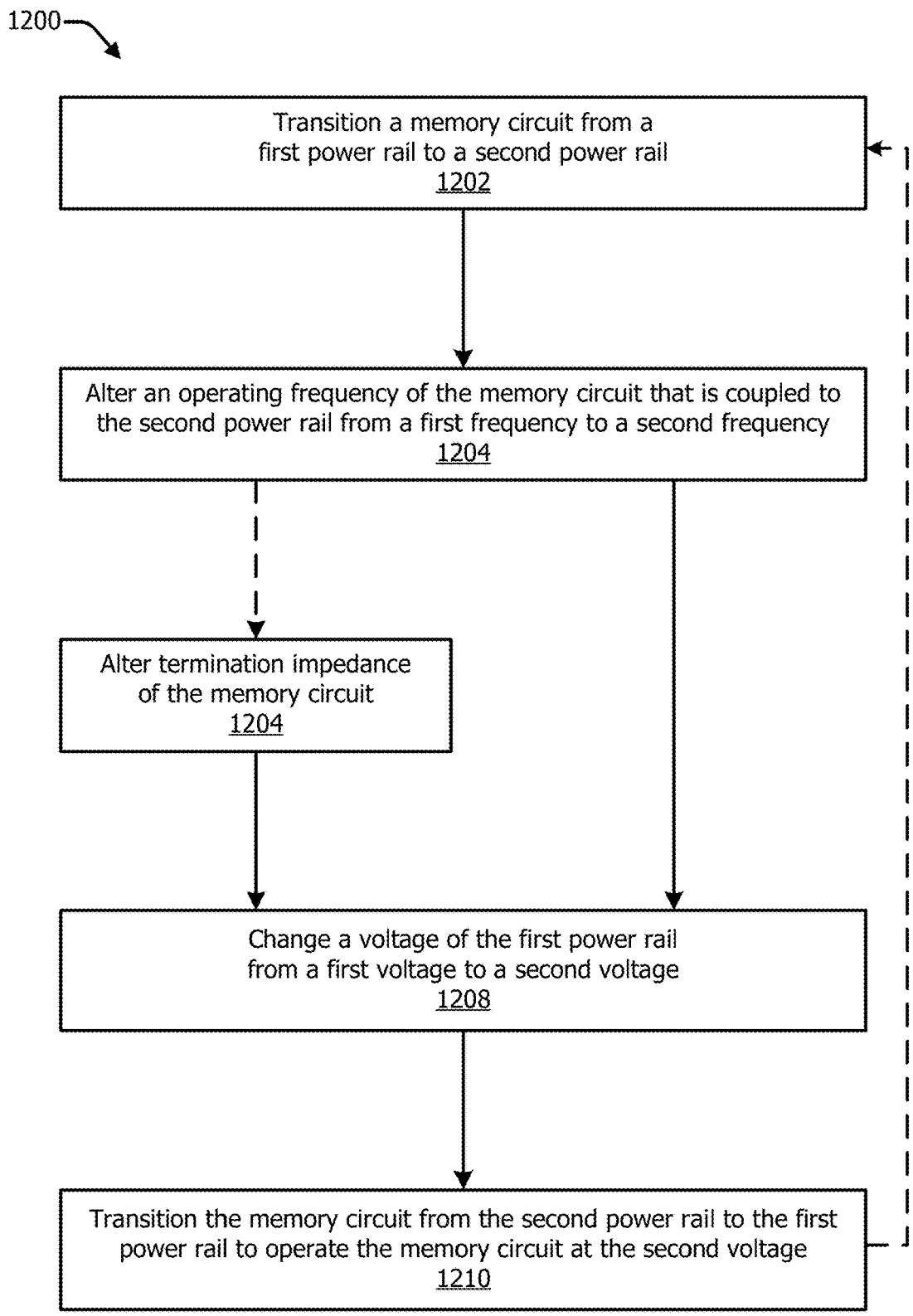
FIG. 12 illustrates another example method for multi-rail power transition for a memory circuit.

FIG. 12 depicts a flow diagram 1200 of another example method for multi-rail power transition. The flow diagram 1200 includes operations 1202 through 1210, which a power rail controller 110 and/or write timing compensator 112 of a memory controller 108 may perform to implement aspects of multi-rail power transition and/or write timing compensation as described herein.

At 1202, a memory controller transitions a memory circuit from a first power rail to a second power rail. For example, the memory controller can transition the memory circuit from a dynamic power rail to a static power rail, which may include a core path power rail of the memory die or memory device in which the memory circuit is embodied. In some cases, the memory controller transitions the memory circuit to the second power rail before increasing a frequency of operation of the memory circuit.

At 1204, the memory controller alters an operating frequency of the memory circuit that is coupled to the second power rail from a first frequency to a second frequency. For example, the memory controller may increase a frequency of a write clock used by the memory circuit to implement write operations for data received from the memory controller. Optionally at 1206, the memory controller alters a termination impedance of the memory circuit. In some cases, the memory controller alters the termination impedance of clock lines or data signal lines of the memory circuit based on the second frequency selected for operation of the memory circuit.

At 1208, the memory controller changes a voltage of the first power rail from a first voltage to a second voltage. In aspects, the memory controller changes the voltage of the first power rail or a dynamic power rail while the memory circuit operates from the second power rail and/or at the second operating frequency. By so doing, the memory controller can scale voltage of the dynamic power supply without impairing signal integrity or signal timing of the memory circuit.

At 1210, the memory controller transitions the memory circuit from the second power rail to the first power rail to operate the memory circuit at the second voltage. In aspects, the memory controller transitions the memory circuit from the static power rail back to the dynamic power rail after the dynamic power rail reaches the second voltage as set or configured by the memory controller. The memory circuit may operate from the dynamic power rail at the second voltage to reduce power consumption of the memory circuit or to increase performance of the memory circuit.

Figure 13:
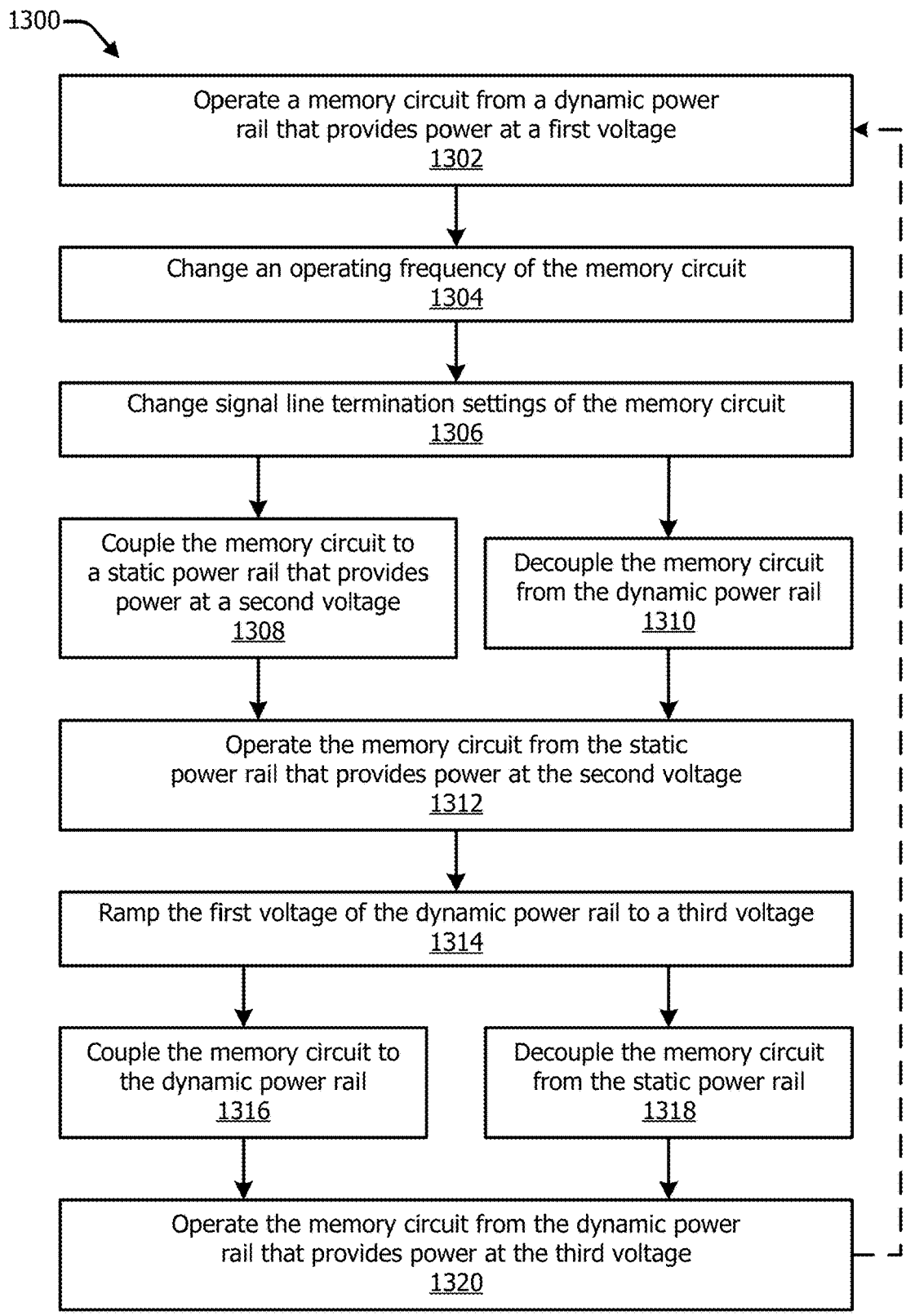
FIG. 13 illustrates an example method for transitioning a memory circuit from a first operating voltage to a second operating voltage, which may be higher than the first operating voltage.

FIG. 13 depicts a flow diagram 1300 of an example method for transitioning a memory circuit from a first operating voltage to a second operating voltage with multiple power rails in accordance with one or more aspects. The flow diagram 1300 includes operations 1302 through 1320, which a power rail controller 110 and/or write timing compensator 112 of a memory controller 108 may perform to implement aspects of multi-rail power transition and/or write timing compensation as described herein.

At 1302, a memory controller operates a memory circuit from a dynamic power rail that provides power at a first voltage. The memory circuit may operate at the first voltage to enable operation of the memory circuit at a particular frequency or enable access to the memory circuit with a specific bandwidth performance or speed grade. At 1304, the memory controller changes an operating frequency of the memory circuit and, at 1306, the memory controller changes signal line termination settings of the memory circuit. As described herein, the memory controller may configure the frequency or termination settings of the memory circuit for operation at a different voltage level.

At 1308, the memory controller couples the memory circuit to a static power rail that provides power at a second voltage and, at 1310, the memory controller decouples the memory circuit from the dynamic power rail. The operations 1308 and 1310 may be implemented by activating or deactivating respective switches coupled between the power rails and the memory circuit to transition the memory device from the dynamic power rail to the static power rail. At 1312, the memory controller operates the memory circuit from the static power rail at the second voltage. While the memory circuit operates from the second power rail, which may include a static power rail, the memory controller ramps the dynamic power rail to a third voltage at 1304.

At 1316, the memory controller couples the memory circuit to the dynamic power rail, and at 1318, the memory controller decouples the memory circuit from the static power rail. The operations 1316 and 1318 may be implemented by activating or deactivating the respective switches coupled between the power rails and the memory circuit to transition the memory device from the static power rail to the dynamic power rail. At 1320, the memory controller operates the memory circuit from the dynamic power rail that provides power at the third voltage. In some cases, the third voltage is lower than the first voltage, such that the memory circuit consume less power while operating from the dynamic power rail. Alternatively, the third voltage may be higher than the first voltage, enabling the memory circuit to operate at a higher frequency to increase performance of the memory circuit.

Figure 14:
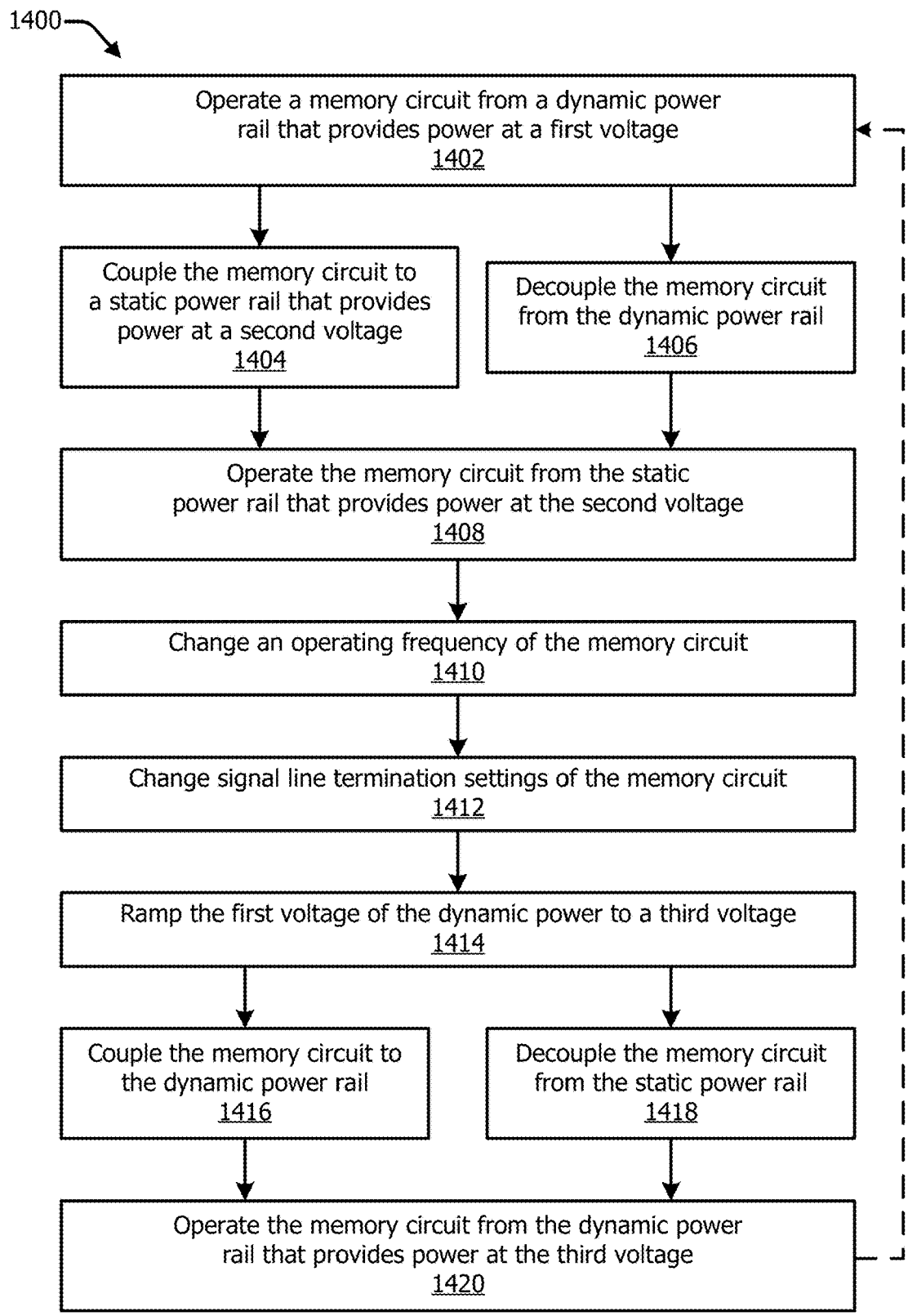
FIG. 14 illustrates an example method for transitioning a memory circuit from a first operating voltage to a second operating voltage, which may be lower than the first operating voltage.

FIG. 14 depicts a flow diagram 1400 of an example method for transitioning a memory circuit from a first operating voltage to a second operating voltage with multiple power rails in accordance with one or more aspects. The flow diagram 1400 includes operations 1402 through 1420, which a power rail controller 110 and/or write timing compensator 112 of a memory controller 108 may perform to implement aspects of multi-rail power transition and/or write timing compensation as described herein.

At 1402, a memory controller operates a memory circuit from a dynamic power rail that provides power at a first voltage. The memory circuit may operate at the first voltage to enable operation of the memory circuit at a particular frequency or enable access to the memory circuit with a specific bandwidth performance level.

At 1404, the memory controller couples the memory circuit to a static power rail that provides power at a second voltage, and at 1406, the memory controller decouples the memory circuit from the dynamic power rail. The operations 1404 and 1406 may be implemented by activating or deactivating respective switches coupled between the power rails and the memory circuit to transition the memory device from the dynamic power rail to the static power rail.

At 1408, the memory controller operates the memory circuit from the static power rail at the second voltage. At 1410 the memory controller changes an operating frequency of the memory circuit and changes signal line termination settings of the memory circuit at 1412. By so doing, the memory controller may configure the memory device for operation at a different voltage then the first voltage of the dynamic power rail.

At 1414, the memory controller ramps the dynamic power rail to a third voltage. In aspects, the memory controller may ramp the dynamic power rail down to the third voltage that is less than the first voltage to enable reduced power consumption by the memory circuit. Alternatively, the memory controller can ramp the dynamic power rail up to a third voltage that is higher than the first voltage to enable increased clock rates and bandwidth for the memory circuit.

At 1416, the memory controller couples the memory circuit to the dynamic power rail, and at 1418, the memory controller decouples the memory circuit from the static power rail. The operations 1416 and 1418 may be implemented by activating or deactivating respective switches coupled between the power rails and the memory circuit to transition the memory device from the static power rail to the dynamic power rail.

At 1420, the memory controller operates the memory circuit from the dynamic power rail that provides power at the third voltage. In some cases, the third voltage is lower than the first voltage, such that the memory circuit consume less power while operating from the dynamic power rail. Alternatively, the third voltage may be higher than the first voltage, enabling the memory circuit to operate at a higher frequency to increase performance of the memory circuit.

Figure 15:
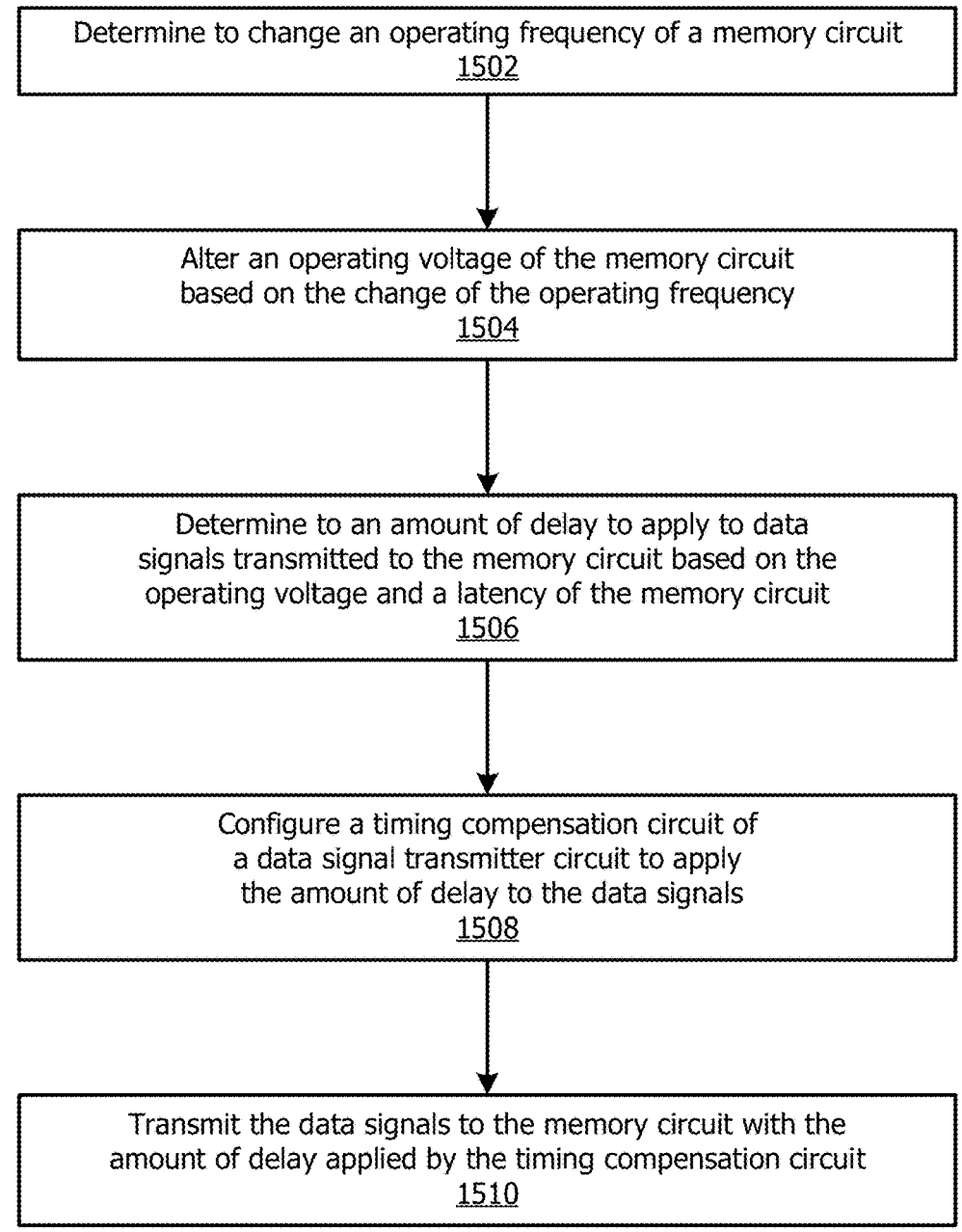
FIG. 15 illustrates an example method for write timing compensation in accordance with one or more aspects.

FIG. 15 depicts a flow diagram 1500 of an example method for write timing compensation in accordance with one or more aspects. The flow diagram 1500 includes operations 1502 through 1510, which a power rail controller 110 and/or write timing compensator 112 of a memory controller 108 may perform to implement aspects of multi-rail power transition and/or write timing compensation as described herein.

At 1502, a memory controller determines to change an operating frequency of a memory circuit. In aspects, the memory controller may determine to reduce the operating frequency of the memory circuit to reduce power consumption of the memory circuit. Alternatively, the memory controller may determine to increase the operating frequency of the memory circuit to increase performance of the memory circuit (e.g., increase bandwidth from 3.2 Gbps to 6.4 Gbps or 12.8 Gbps).

At 1504, the memory controller alters an operating voltage of the memory circuit based on the change in operating frequency. Generally, the memory controller may scale the voltage based on the change in operating frequency. For example, the memory controller may reduce the operating voltage of the memory circuit when the operating frequency is decreased.

At 1506, the memory controller determines an amount of delay to apply to data signal transmitted to the memory circuit based on the operating voltage of the memory circuit. In aspects, changes in operating frequency and/or operating voltage may affect signal timing or signal integrity of data signals communicated between the memory controller and the memory circuit. Based on operating parameters of the memory circuit, such as voltage, frequency, latency, termination impedance, and so forth, the memory controller may determine the amount of delay to apply to one or more data signals transmitted to the memory circuit.

At 1508, the memory controller configures a timing compensation circuit of a data signal transmitter circuit to apply the amount of delay applied to the data signals transmitted to the memory circuit. In aspects, the timing compensation circuit may include a set of buffers connected in series, with respective switches coupling the outputs of the buffers to an output of the timing compensation circuit. In such cases, the memory controller may determine how many buffers of the set of buffers to use in order to apply a delay to data signals transmitted to the memory circuit.

At 1510, the memory controller transmits the data signals the memory circuit with the amount of delay applied by the timing compensation circuit. By so doing, the memory controller may use the timing compensation circuit to improve relative signal timing or signal integrity of the data signals transmitted to the memory circuit over a range of varying operating conditions, such as frequency and/or voltage (e.g., eye diagram 1003 of FIG. 10).

For the flow charts and flow diagrams described above, the orders in which operations are shown and/or described are not intended to be construed as a limitation. Any number or combination of the described process operations can be combined or rearranged in any order to implement a given method or an alternative method. Operations may also be omitted from or added to the described methods. Further, described operations can be implemented in fully or partially overlapping manners.

Aspects of these methods or operations may be implemented in, for example, hardware (e.g., fixed-logic circuitry or a processor in conjunction with a memory), firmware, or some combination thereof. The methods may be realized using one or more of the apparatuses, systems, or components shown in FIGS. 1-10, the components of which may be further divided, combined, rearranged, and so on. The devices, systems, and components of these figures generally represent firmware, such as executable-code or the actions thereof; hardware, such as electronic devices, packaged modules, IC chips, or circuits; software, such as processor-executable instructions; or a combination thereof. The illustrated apparatuses 100 and components of 200, include, for instance, a memory controller 108, a power rail controller 110, a write timing compensator 112, an interconnect 114, control circuitry 120, a memory die 122, and a PMIC 126. A host 102 can include a processor 106 and a memory controller 108. A memory device 116 may include a registered clock driver 118, control circuitry 120, a memory die 122, a PMIC 126, which is coupled to a PDN 202 that includes multiple power rails (e.g., static power rail, dynamic power rail). A memory die 122 may include at least a portion of the PDN 202 and a memory array 124 that operates using power provided by the PDN 202 and/or signals (e.g., clock signal and data signals) provided by the control circuitry 120 of the memory device 116 or internal memory die circuitry. Thus, these figures illustrate some of the many possible systems or apparatuses capable of implementing the described methods.

Computer-readable media includes both non-transitory computer storage media and communication media including any medium that facilitates transfer of a computer program (e.g., an application) or data from one entity to another. Non-transitory computer storage media can be any available medium accessible by a computer, such as RAM, ROM, Flash, EEPROM, optical media, and magnetic media.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

In the following, various examples of multi-rail power transition are described:

Example 1: An apparatus comprising: a memory circuit comprising at least one memory array; an interface for a memory interconnect; a power management integrated circuit (PMIC) configured to provide first power at a first output of the PMIC and second power at a second output of the PMIC; a power distribution network configured to provide power to the memory circuit to enable access to the at least one memory array using the interface for the memory interconnect, the power distribution network comprising: a first power rail coupled to the first output of the PMIC; a second power rail coupled to the second output of the PMIC; a first switch coupled between the first power rail and the memory circuit; and a second switch coupled between the second power rail and the memory circuit.

Example 2: The apparatus as recited by example 1 or any other example, wherein: the PMIC is further configured to provide the first power at the first output of the PMIC at a static voltage level; and the PMIC is further configured to provide the second power at the second output of the PMIC with an adjustable voltage level.

Example 3: The apparatus as recited by example 2 or any other example, further comprising write clock circuitry configured to enable access to the at least one memory array using the interface to the memory interconnect, the write clock circuitry comprising at least one of a buffer or a driver that is operably coupled to the second power rail.

Example 4: The apparatus as recited by example 3 or any other example, wherein the at least one buffer or the at least one driver operably coupled to the second power rail comprise: at least two buffers connected in series and operably coupled to the second power rail; or at least two drivers connected in series and operably coupled to the second power rail.

Example 5: The apparatus as recited by example 3 or any other example, wherein the write clock circuitry further comprises a write clock receive amplifier having an output that is operably coupled to an input of the at least one buffer or the at least one driver.

Example 6: The apparatus as recited by example 3 or any other example, further comprising write path circuitry that includes a serial-to-parallel component having an input coupled to an output of the at least one buffer or the at least one driver.

Example 7: The apparatus as recited by example 3 or any other example, further comprising write path circuitry that includes a serial-to-parallel component having an input coupled to an output of the at least one buffer or the at least one driver.

Example 8: The apparatus as recited by example 3 or any other example, further comprising write path circuitry that includes a data signal receive buffer having a clock input coupled to an output of the at least one buffer or the at least one driver.

Example 9: The apparatus as recited by example 1 or any other example, further comprising write path circuitry that includes a data signal receive buffer that is operably coupled to the second power rail.

Example 10: The apparatus as recited by example 1 or any other example, wherein the memory circuit comprises a memory die that includes the memory array, the memory die comprises an internal power rail configured to provide power to the memory array, and the internal power rail of the memory die is coupled to the first power rail and the second power rail.

Example 11: The apparatus as recited by example 1 or any other example, further comprising a core configured to enable access to the at least one memory array using the interface for the memory interconnect and wherein the power distribution network further comprises a third power rail that is coupled to the first output of the PMIC and configured to provide power to core of the apparatus.

Example 12: The apparatus as recited by example 1 or any other example, further comprising a mode register and wherein the PMIC is further configured to: activate, in response to a first command received by the mode register, the first switch to couple the first power rail to the memory circuit; deactivate, in response to the first command received by the mode register, the second switch to decouple the second power rail to the memory circuit; change, in response to a second command received by the mode register, a voltage of the power provided at the second output of the PMIC from a first voltage to a second voltage; deactivate, in response to a third command received by the mode register, the first switch to decouple the first power rail to the memory circuit; and activate, in response to the third command received by the mode register, the second switch to couple the second power rail to the memory circuit to operate the memory circuit at the second voltage.

Example 13: The apparatus as recited by example 1 or any other example, wherein the access to the at least one memory array using the interface for the memory interconnect is implemented in compliance with a standard for synchronous dynamic random-access memory configured as a memory device with one channel containing either 16 or 8 DQ signals, double-data-rate I/O signaling, and to support a supply voltage of 0.3-0.5V.

Example 14: The apparatus as recited by example 1 or any other example, wherein the first switch or the second switch comprises one or more of: a field-effect transistor (FET); a metal-oxide-semiconductor field-effect transistor (MOSFET); or a transistor.

Example 15: A method comprising: altering an operating frequency of a memory circuit that is coupled to a first power rail from a first frequency to a second frequency; transitioning the memory circuit from the first power rail to a second power rail; changing a voltage of the first power rail from a first voltage to a second voltage while the memory circuit operates from the second power rail; and transitioning the memory circuit from the second power rail to the first power rail to operate the memory circuit from the second power rail at the second voltage Example 16: The method as recited by example 15 or any other example, further comprising altering a termination impedance of the memory circuit prior to transitioning the memory circuit from the first power rail to the second power rail.

Example 17: The method as recited by example 16 or any other example, wherein altering the termination impedance comprises: determining a termination impedance setting for the memory circuit based on the second frequency; and configuring a termination circuit of the memory circuit using the termination impedance setting.

Example 18: The method as recited by example 15 or any other example, wherein transitioning the memory circuit from the first power rail to the second power rail comprises: activating a first switch to couple the memory circuit to the second power rail; and deactivating a second switch to decouple the memory circuit from the first power rail.

Example 19: The method as recited by example 18 or any other example, wherein transitioning the memory circuit from the second power rail to the first power rail comprises: activating the first switch to couple the memory circuit to the first power rail; and deactivating the second switch to decouple the memory circuit from the second power rail.

Example 20: The method as recited by example 15 or any other example, further comprising: determining the second voltage for the first power rail based on the second frequency of the memory circuit, and wherein changing the voltage of the first power rail comprises: ramping the first power rail down from the first voltage to the second voltage.

Example 21: The method as recited by example 15 or any other example, wherein the second power rail provides power at a third voltage that is lower than the first voltage or the second voltage.

Example 22: The method as recited by example 15 or any other example, wherein the second power rail provides power at a third voltage that is higher than the first voltage or the second voltage.

Example 23: A method comprising: transitioning a memory circuit from a first power rail to a second power rail; altering an operating frequency of the memory circuit that is coupled to the second power rail from a first frequency to a second frequency; changing a voltage of the first power rail from a first voltage to a second voltage while the memory circuit operates from the second power rail; and transitioning the memory circuit from the second power rail to the first power rail to operate the memory circuit from the second power rail at the second voltage.

Example 24: The method as recited by example 23 or any other example, further comprising altering a termination impedance of the memory circuit prior to transitioning the memory circuit from the first power rail to the second power rail.

Example 25: The method as recited by example 24 or any other example, wherein altering the termination impedance comprises: determining a termination impedance setting for the memory circuit based on the second frequency; and configuring a termination circuit of the memory circuit using the termination impedance setting.

Example 26: The method as recited by example 23 or any other example, wherein transitioning the memory circuit from the first power rail to the second power rail comprises: activating a first switch to couple the memory circuit to the second power rail; and deactivating a second switch to decouple the memory circuit from the first power rail.

Example 27: The method as recited by example 23 or any other example, wherein transitioning the memory circuit from the second power rail to the first power rail comprises: activating the first switch to couple the memory circuit to the first power rail; and deactivating the second switch to decouple the memory circuit from the second power rail.

Example 28: The method as recited by example 23 or any other example, further comprising: determining the second voltage for the first power rail based on the second frequency of the memory circuit, and wherein changing the voltage of the first power rail comprises: ramping the first power rail up from the first voltage to the second voltage.

Example 29: The method as recited by example 23 or any other example, wherein the second power rail provides power at a third voltage that is lower than the first voltage or the second voltage.

Example 30: The method as recited by example 23 or any other example, wherein the second power rail provides power at a third voltage that is higher than the first voltage or the second voltage.

CONCLUSION

Although aspects of multi-rail power transition or write timing compensation have been described in language specific to certain features and/or methods, the subject of the appended claims is not necessarily limited to the specific features or methods described. Rather, the specific features and methods are disclosed as a variety of example implementations of multi-rail power transition.

What is claimed is:
1. An apparatus comprising:
a memory circuit comprising at least one memory array;
an interface for a memory interconnect;
a power management integrated circuit (PMIC) configured to provide first power at a first output of the PMIC at a first voltage level that is a static voltage level and provide second power at a second output of the PMIC with an adjustable voltage level, the adjustable voltage level adjustable between a second voltage level and a third voltage level; and
a power distribution network configured to provide power to the memory circuit to enable access to the at least one memory array using the interface for the memory interconnect, the power distribution network comprising:

a first power rail coupled to the first output of the PMIC;

a second power rail coupled to the second output of the PMIC;

a first switch coupled between the first power rail and the memory circuit; and a second switch coupled between the second power rail and the memory circuit.

2. The apparatus as recited by claim 1, further comprising write clock circuitry configured to enable access to the at least one memory array using the interface to the memory interconnect, the write clock circuitry comprising at least one of a buffer or a driver that is operably coupled to the second power rail.

3. The apparatus as recited by claim 2, wherein the at least one of the buffer or the at least one of the driver operably coupled to the second power rail comprise:

at least two buffers connected in series and operably coupled to the second power rail; or at least two drivers connected in series and operably coupled to the second power rail.

4. The apparatus as recited by claim 2, wherein the write clock circuitry further comprises a write clock receive amplifier having an output that is operably coupled to an input of the at least one buffer or the at least one driver.

5. The apparatus as recited by claim 2, further comprising write path circuitry that includes a serial-to-parallel component having an input coupled to an output of the at least one buffer or the at least one driver.

6. The apparatus as recited by claim 2, further comprising write path circuitry that includes a data signal receive buffer having a clock input coupled to an output of the at least one buffer or the at least one driver.

7. The apparatus as recited by claim 1, further comprising write path circuitry that includes a data signal receive buffer that is operably coupled to the second power rail.

8. The apparatus as recited by claim 1, wherein the memory circuit comprises a memory die that includes the memory array, the memory die comprises an internal power rail configured to provide power to the memory array, and the internal power rail of the memory die is coupled to the first power rail and the second power rail.

9. The apparatus as recited by claim 1, further comprising a core configured to enable access to the at least one memory array using the interface for the memory interconnect and wherein the power distribution network further comprises a third power rail that is coupled to the first output of the PMIC and configured to provide power to core of the apparatus.

10. The apparatus as recited by claim 1, further comprising a mode register and wherein the PMIC is further configured to:

activate, in response to a first command received by the mode register, the first switch to couple the first power rail to the memory circuit; and deactivate, in response to the first command received by the mode register, the second switch to decouple the second power rail to the memory circuit.

11. The apparatus as recited by claim 10, wherein the PMIC is further configured to:

change, in response to a second command received by the mode register, the adjustable voltage level of the power provided at the second output of the PMIC from the second voltage to the third voltage;

deactivate, in response to a third command received by the mode register, the first switch to decouple the first power rail to the memory circuit; and activate, in response to the third command received by the mode register, the second switch to couple the second power rail to the memory circuit to operate the memory circuit at the third voltage.

12. The apparatus as recited by claim 1, wherein the access to the at least one memory array using the interface for the memory interconnect is implemented in compliance with a standard for synchronous dynamic random-access memory configured as a memory device with one channel containing either 16 or 8 DQ signals, double-data-rate I/O signaling, and to support a supply voltage of 0.3-0.5V.

13. The apparatus as recited by claim 1, wherein the first switch or the second switch comprises one or more of:

a field-effect transistor (FET);

a metal-oxide-semiconductor field-effect transistor (MOSFET); or a transistor.

14. A method comprising:

altering an operating frequency of a memory circuit that is coupled to a first power rail from a first frequency to a second frequency;

transitioning the memory circuit from the first power rail to a second power rail;

changing a voltage of the first power rail from a first voltage to a second voltage while the memory circuit operates from the second power rail; and transitioning the memory circuit from the second power rail to the first power rail to operate the memory circuit from the second power rail at the second voltage.

15. The method as recited by claim 14, further comprising altering a termination impedance of the memory circuit prior to transitioning the memory circuit from the first power rail to the second power rail.

16. The method as recited by claim 15, wherein altering the termination impedance comprises:

determining a termination impedance setting for the memory circuit based on the second frequency; and configuring a termination circuit of the memory circuit using the termination impedance setting.

17. The method as recited by claim 14, wherein transitioning the memory circuit from the first power rail to the second power rail comprises:

activating a first switch to couple the memory circuit to the second power rail; and deactivating a second switch to decouple the memory circuit from the first power rail.

18. The method as recited by claim 17, wherein transitioning the memory circuit from the second power rail to the first power rail comprises:

activating the first switch to couple the memory circuit to the first power rail; and deactivating the second switch to decouple the memory circuit from the second power rail.

19. The method as recited by claim 14, further comprising:

determining the second voltage for the first power rail based on the second frequency of the memory circuit, and wherein changing the voltage of the first power rail comprises:

ramping the first power rail down from the first voltage to the second voltage.

20. The method as recited by claim 14, wherein the second power rail provides power at a third voltage that is lower than the first voltage or the second voltage.

21. The method as recited by claim 14, wherein the second power rail provides power at a third voltage that is higher than the first voltage or the second voltage.

22. A method comprising:
- transitioning a memory circuit from a first power rail to a second power rail;
- altering an operating frequency of the memory circuit that is coupled to the second power rail from a first frequency to a second frequency;
- changing a voltage of the first power rail from a first voltage to a second voltage while the memory circuit operates from the second power rail; and
- transitioning the memory circuit from the second power rail to the first power rail to operate the memory circuit from the second power rail at the second voltage.

23. The method as recited by claim 22, further comprising altering a termination impedance of the memory circuit prior to transitioning the memory circuit from the first power rail to the second power rail.

24. The method as recited by claim 23, wherein altering the termination impedance comprises:
- determining a termination impedance setting for the memory circuit based on the second frequency; and
- configuring a termination circuit of the memory circuit using the termination impedance setting.

25. The method as recited by claim 22, wherein transitioning the memory circuit from the first power rail to the second power rail comprises:
- activating a first switch to couple the memory circuit to the second power rail; and
- deactivating a second switch to decouple the memory circuit from the first power rail.

26. The method as recited by claim 25, wherein transitioning the memory circuit from the second power rail to the first power rail comprises:
- activating the first switch to couple the memory circuit to the first power rail; and
- deactivating the second switch to decouple the memory circuit from the second power rail.

27. The method as recited by claim 22, further comprising:
- determining the second voltage for the first power rail based on the second frequency of the memory circuit, and wherein changing the voltage of the first power rail comprises:
- ramping the first power rail up from the first voltage to the second voltage.

28. The method as recited by claim 22, wherein the second power rail provides power at a third voltage that is lower than the first voltage or the second voltage.

29. The method as recited by claim 22, wherein the second power rail provides power at a third voltage that is higher than the first voltage or the second voltage.

* * * * *